US012813285B2

(12) United States Patent
Aikawa et al.

(10) Patent No.: US 12,813,285 B2
(45) Date of Patent: Nov. 24, 2026

(54) RADIO-FREQUENCY MODULE AND COMMUNICATION DEVICE

(71) Applicant: Murata Manufacturing Co., Ltd., Nagaokakyo (JP)

(72) Inventors: Kiyoshi Aikawa, Nagaokakyo (JP); Hiromichi Kitajima, Nagaokakyo (JP); Takashi Yamada, Nagaokakyo (JP); Yoshihiro Daimon, Nagaokakyo (JP); Takanori Uejima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 546 days.

(21) Appl. No.: 18/477,564

(22) Filed: Sep. 29, 2023

(65) Prior Publication Data

US 2024/0030163 A1 Jan. 25, 2024

Related U.S. Application Data

(63) Continuation of application No. PCT/JP2022/010865, filed on Mar. 11, 2022.

(30) Foreign Application Priority Data

Mar. 31, 2021 (JP) ................................ 2021-060341

(51) Int. Cl.
*H10W 44/00* (2026.01)
*H03F 1/56* (2006.01)
(Continued)

(52) U.S. Cl.
CPC .......... *H10W 44/501* (2026.01); *H03F 1/565* (2013.01); *H03F 3/213* (2013.01);
(Continued)

(58) Field of Classification Search
CPC ... H10W 42/20; H10W 44/20; H10W 44/234; H10W 44/248; H10W 44/501;
(Continued)

(56) References Cited

U.S. PATENT DOCUMENTS

2015/0366063 A1* 12/2015 Takagi ..................... H05K 1/09 29/831
2020/0052663 A1* 2/2020 Koya .................. H01F 17/0013
(Continued)

FOREIGN PATENT DOCUMENTS

JP 2003-132327 A 5/2003
JP 2020-507230 A 3/2020
(Continued)

OTHER PUBLICATIONS

International Search Report and Written Opinion mailed on Apr. 19, 2022, received for PCT Application PCT/JP2022/010865, filed on Mar. 11, 2022, 18 pages including English Translation.

*Primary Examiner* — Nguyen T Vo
(74) *Attorney, Agent, or Firm* — XSENSUS LLP

(57) ABSTRACT

A radio-frequency module includes module substrates, multiple electronic components, and multiple external connection terminals. The module substrate has major surfaces that are opposite to each other. The module substrate has major surfaces that are opposite to each other. The module substrate is disposed such that the major surface faces the major surface. The multiple electronic components are disposed between the major surfaces, at the major surface, or at the major surface. The external connection terminals are disposed at the major surface. The multiple electronic components include one or more first electronic components each including at least a transistor and one or more second electronic components each not including any transistor. At the major surface, at least one of the one or more first
(Continued)

electronic components is disposed, and the one or more second electronic components are not disposed.

20 Claims, 17 Drawing Sheets

(51) Int. Cl.

| | |
|---|---|
| ***H03F 3/213*** | (2006.01) |
| ***H04B 1/40*** | (2015.01) |
| ***H10W 44/20*** | (2026.01) |
| ***H10W 90/00*** | (2026.01) |

(52) U.S. Cl.
CPC .............. *H04B 1/40* (2013.01); *H10W 44/20* (2026.01); *H10W 44/601* (2026.01); *H10W 90/00* (2026.01); *H03F 2200/451* (2013.01); *H10W 44/234* (2026.01); *H10W 44/248* (2026.01)

(58) Field of Classification Search
CPC ... H10W 44/601; H10W 70/60; H10W 90/00; H10W 99/00; H03F 1/565; H03F 2200/294; H03F 2200/451; H03F 2203/7209; H03F 3/195; H03F 3/213; H03F 3/245; H03F 3/72; H04B 1/00; H04B 1/38; H04B 1/40
See application file for complete search history.

(56) References Cited

U.S. PATENT DOCUMENTS

| | | | | |
|---|---|---|---|---|
| 2020/0203291 | A1* | 6/2020 | Uejima | H03F 1/565 |
| 2021/0091800 | A1* | 3/2021 | Sawada | H03F 3/72 |

FOREIGN PATENT DOCUMENTS

| | | | |
|---|---|---|---|
| JP | 2021-500838 | A | 1/2021 |
| WO | 2020/022180 | A1 | 1/2020 |
| WO | 2021/039014 | A1 | 3/2021 |
| WO | 2021/039068 | A1 | 3/2021 |

* cited by examiner

RADIO-FREQUENCY MODULE AND COMMUNICATION DEVICE

CROSS-REFERENCE TO RELATED APPLICATIONS

The present application is a continuation of PCT application PCT/JP2022/010865, filed on Mar. 11, 2022, which claims priority from Japanese patent application no. 2021-060341, filed on Mar. 31, 2021, the entire contents of each being incorporated herein by reference.

TECHNICAL FIELD

The present disclosure relates to a radio-frequency module and a communication device.

BACKGROUND ART

In mobile communication devices, such as mobile phones, the complexity of radio-frequency front-end modules has grown, particularly with the development of multiband operation. Patent Document 1 discloses a technology that reduces the size of a radio-frequency module by using two module substrates.

CITATION LIST

Patent Document

Patent Document 1: International Publication No. 2020/022180

SUMMARY

Technical Problems

One exemplary issue that is addressed by the present disclosure is that the known technology described above increases the height of the radio-frequency module.

The present disclosure provides, among other things, a radio-frequency module and a communication device of reduced sizes, implemented without increasing the height.

Solution to Problem

A radio-frequency module according to an aspect of the present disclosure includes module substrates, multiple electronic components, and multiple external connection terminals. The module substrate has major surfaces that are opposite to each other. The module substrate has major surfaces that are opposite to each other. The module substrate is disposed such that the major surface faces the major surface. The multiple electronic components are disposed between the major surfaces, at the major surface, or at the major surface. The external connection terminals are disposed at the major surface. The multiple electronic components include one or more first electronic components each including at least a transistor and one or more second electronic components each not including any transistor. At the major surface, at least one of the one or more first electronic components is disposed, and the one or more second electronic components are not disposed.

A radio-frequency module according to an aspect of the present disclosure includes a first module substrate having a first major surface and a second major surface that are opposite to each other, a second module substrate having a third major surface and a fourth major surface that are opposite to each other, the second module substrate being disposed such that the third major surface faces the second major surface, multiple electronic components disposed between the second major surface and the third major surface, at the first major surface, and at the fourth major surface, and multiple external connection terminals disposed at the fourth major surface. The multiple electronic components include multiple chip inductors. Between the second major surface and the third major surface, the chip inductors are disposed, and at the first major surface and at the fourth major surface, no chip inductor is disposed; at the first major surface, the chip inductors are disposed, and between the second major surface and the third major surface and at the fourth major surface, no chip inductor is disposed; or at the fourth major surface, the chip inductors are disposed, and between the second major surface and the third major surface and at the first major surface, no chip inductor is disposed.

Advantageous Effects of the Disclosure

The radio-frequency module according to an aspect of the present disclosure achieves a reduced size without increasing the height.

DESCRIPTION OF EMBODIMENTS

Figure 1:
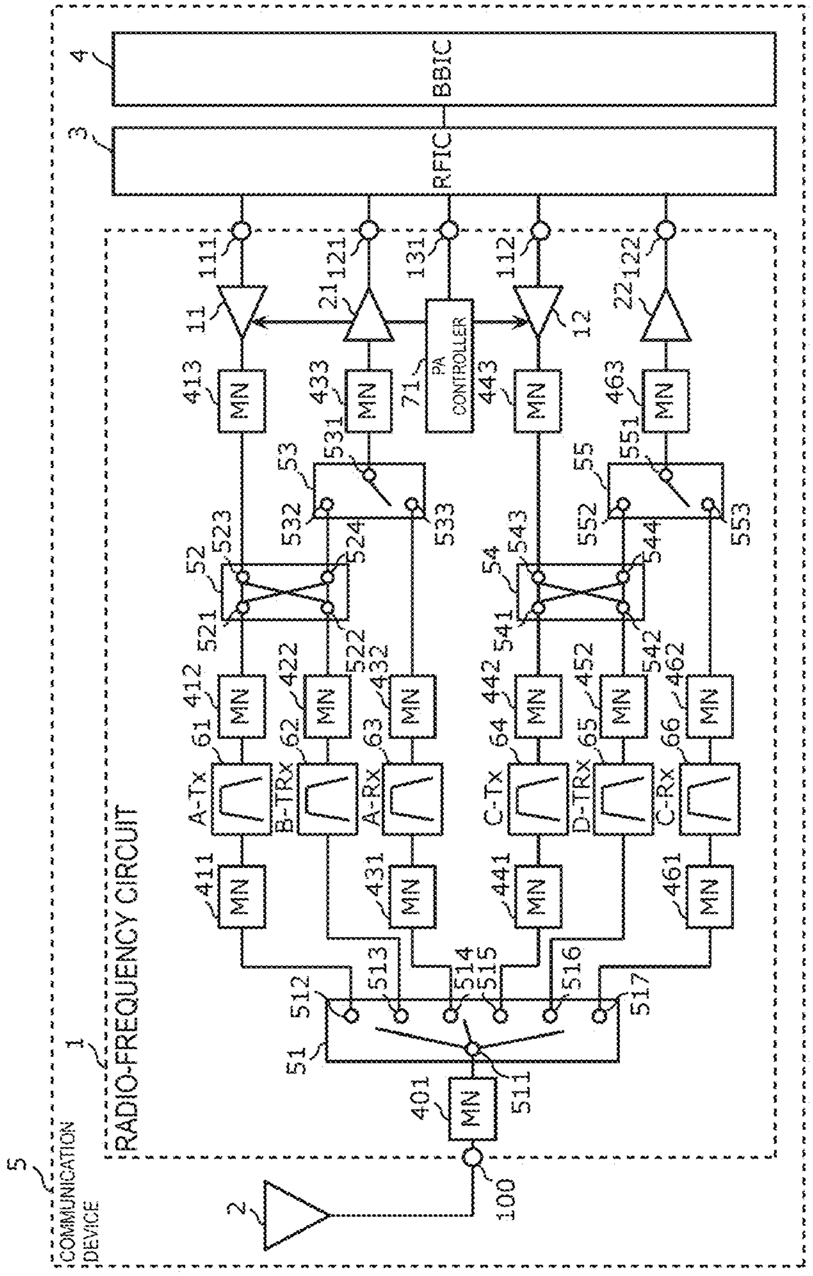
FIG. 1 is a circuit configuration diagram of a radio-frequency circuit according to an embodiment and a communication device according to the embodiment.

Hereinafter, an embodiment of the present disclosure will be described in detail with reference to the drawings. The embodiment described below is a comprehensive or specific example. Details including numerical values, shapes, materials, constituent elements, arrangements of the constituent elements, and connection modes of the constituent elements given in the following embodiment are merely an example and are not intended to limit the scope of the appended claims.

The drawings are schematically illustrated with appropriate accentuation, omission, or proportion adjustment to depict the present disclosure and are not necessarily illustrated in an exact manner; therefore, the shape, positional relationship, and proportion may be different from actual ones. Like reference symbols are used to denote substantially like configuration elements in the drawings, and redundant descriptions thereof can be omitted or simplified.

In the drawings described later, the x axis and the y axis are perpendicular to each other in a plane parallel to the major surfaces of a module substrate. Specifically, under a condition the module substrate is rectangular in plan view, the x axis is parallel to a first side of the module substrate, and the y axis is parallel to a second side perpendicular to the first side of the module substrate. The z axis is perpendicular to the major surfaces of the module substrate. Along the z axis, the positive direction indicates upward, and the negative direction indicates downward.

In the circuit configurations of the present disclosure, the term "coupled" applies under a condition a circuit element is directly coupled to another circuit element via a connection terminal and/or a wiring conductor. The term also applies under a condition a circuit element is electrically coupled to another circuit element via still another circuit element. The expression "is coupled between A and B" denotes that a circuit element is positioned between A and B and coupled to both of A and B. The expression also includes the case in which the circuit element is coupled in series in a path connecting A and B and the case in which the circuit element is coupled in parallel (shunt-connected) between the path and the ground.

In the component arrangements of the present disclosure, the expression "plan view" refers to the perspective of an object orthogonally projected onto an xy plane, viewed from the positive side of the z axis. The expression "A overlaps B in plan view" means that the region of A orthogonally projected onto an xy plane overlaps the region of B orthogonally projected onto the xy plane. The expression "A is positioned between B and C" means that at least one of the line segments each connecting a point within B to a point within C passes through A. The expression "A is joined to B" means that A is physically connected to B. Terms used to describe relationships between elements, such as "parallel" and "vertical", terms used to indicate the shape of an element, such as "rectangular", and numerical ranges do not necessarily convey precise meanings. The terms and numerical ranges denote meanings that are substantially the same, involving, for example, several percent differences.

In the component arrangements of the present disclosure, the expression "a component is disposed at a substrate" includes the case in which the component is disposed at a major surface of the substrate and the case in which the component is disposed within the substrate. The expression "a component is disposed at a major surface of a substrate" includes the case in which the component is disposed in contact with the major surface of the substrate. The expression also includes the case in which the component is disposed on the major surface side without making contact with the major surface (for example, under a condition the component is stacked on another component that is disposed in contact with the major surface). The expression "a component is disposed at a major surface of a substrate" may include the case in which the component is disposed in a depressed portion formed at the major surface. The expression "a component is disposed within a substrate" includes the case in which the component is encapsulated in the module substrate. The expression also includes the case in which the component is entirely positioned between the two major surfaces of the substrate but not fully covered by the substrate. The expression further includes the case in which only a portion of the component is disposed within the substrate. The expression "a component is disposed between two major surfaces" includes the case in which the component is disposed in contact with both of the two major surfaces. The expression also includes the case in which the component is disposed in contact with only one of the two major surfaces. The expression further includes the case in which the component is disposed without making contact with either of the two major surfaces.

Embodiment

1 Circuit Configuration of Radio-Frequency Circuit 1 and Communication Device 5

A circuit configuration of a radio-frequency circuit 1 according to the present embodiment and a communication device 5 according to the present embodiment will be described with reference to FIG. 1. FIG. 1 is a circuit configuration diagram of the radio-frequency circuit 1 according to the present embodiment and the communication device 5 according to the present embodiment.

1.1 Circuit Configuration of Communication Device 5

Firstly, a circuit configuration of the communication device 5 will be described. As illustrated in FIG. 1, the communication device 5 according to the present embodiment includes the radio-frequency circuit 1, an antenna 2, a radio-frequency integrated circuit (RFIC) 3, and a baseband integrated circuit (BBIC) 4.

The radio-frequency circuit 1 is operable to transfer radio-frequency signals between the antenna 2 and the RFIC 3. The internal configuration of the radio-frequency circuit 1 will be described later.

The antenna 2 is coupled to an antenna connection terminal 100 of the radio-frequency circuit 1. The antenna 2 is operable to transmit a radio-frequency signal outputted from the radio-frequency circuit 1 and to receive a radio-frequency signal from outside and output the radio-frequency signal to the radio-frequency circuit 1.

The RFIC 3 is an example of a signal processing circuit for processing a radio-frequency signal. Specifically, the RFIC 3 is operable to process, for example by down-conversion, a radio-frequency receive signal inputted through a receive path of the radio-frequency circuit 1 and output the receive signal generated by the signal processing to the BBIC 4. The RFIC 3 is also operable to process, for example by up-conversion, a transmit signal inputted from the BBIC 4 and output the radio-frequency transmit signal generated by the signal processing to a transmit path of the radio-frequency circuit 1. The RFIC 3 include a control unit for controlling elements included in the radio-frequency circuit 1, such as switches and amplifiers. The function of the control unit of the RFIC 3 may be partially or entirely implemented outside the RFIC 3; for example, the function of the control unit of the RFIC 3 may be implemented in the BBIC 4 or the radio-frequency circuit 1.

The BBIC 4 is a baseband signal processing circuit for performing signal processing with an intermediate frequency band that is lower than radio-frequency signals transferred by the radio-frequency circuit 1. Signals such as image signals for image display and/or sound signals for calls through a speaker are used as signals processed by the BBIC 4.

In the communication device 5 according to the present embodiment, the antenna 2 and the BBIC 4 are optional constituent elements.

1.2 Circuit Configuration of Radio-Frequency Circuit 1

The following describes a circuit configuration of the radio-frequency circuit 1. As illustrated in FIG. 1, the radio-frequency circuit 1 includes power amplifiers (PAs) 11 and 12, low-noise amplifiers (LNAs) 21 and 22, matching circuits (MNs) 401, 411 to 413, 422, 431 to 433, 441 to 443, 452, and 461 to 463, switches (SWs) 51 to 55, filters 61 to 66, a PA controller (PAC) 71, the antenna connection terminal 100, radio-frequency input terminals 111 and 112, radio-frequency output terminals 121 and 122, and a control terminal 131. The following describes the constituent elements of the radio-frequency circuit 1 in order.

The antenna connection terminal 100 is coupled to the antenna 2 outside the radio-frequency circuit 1.

The radio-frequency input terminals 111 and 112 are terminals for receiving radio-frequency transmit signals from outside of the radio-frequency circuit 1. In the present embodiment, the radio-frequency input terminals 111 and 112 are coupled to the RFIC 3 outside the radio-frequency circuit 1.

The radio-frequency output terminals 121 and 122 are terminals for supplying radio-frequency receive signals to outside of the radio-frequency circuit 1. In the present embodiment, the radio-frequency output terminals 121 and 122 are coupled to the RFIC 3 outside the radio-frequency circuit 1.

The control terminal 131 is a terminal for transferring control signals. In other words, the control terminal 131 is a terminal for receiving control signals from outside of the radio-frequency circuit 1 and/or a terminal for supplying control signals to outside of the radio-frequency circuit 1. The control signal relates to the control of electronic circuits included in the radio-frequency circuit 1. Specifically, the control signal is a digital signal for controlling, for example, at least one of the power amplifiers 11 and 12, the low-noise amplifiers 21 and 22, and the switches 51 to 55.

The power amplifier 11 is coupled between the radio-frequency input terminal 111 and the filters 61 and 62. The power amplifier 11 is able to amplify transmit signals in bands A and B. Specifically, an input end of the power amplifier 11 is coupled to the radio-frequency input terminal 111. An output end of the power amplifier 11 is coupleable to the filter 61 via the matching circuit 413, the switch 52, and the matching circuit 412. The output end of the power amplifier 11 is coupleable to the filter 62 via the matching circuit 413, the switch 52, and the matching circuit 422.

The power amplifier 12 is coupled between the radio-frequency input terminal 112 and the filters 64 and 65. The power amplifier 12 is able to amplify transmit signals in bands C and D. Specifically, an input end of the power amplifier 12 is coupled to the radio-frequency input terminal 112. The output end of the power amplifier 12 is coupleable to the filter 64 via the matching circuit 443, the switch 54, and the matching circuit 442. The output end of the power amplifier 12 is coupleable to the filter 65 via the matching circuit 443, the switch 54, and the matching circuit 452.

The power amplifiers 11 and 12 are electronic components for obtaining output signals with higher energy than input signals (transmit signals), using power supplied from a power source. Each of the power amplifiers 11 and 12 includes an amplifier transistor. Each of the power amplifiers

11 and 12 may additionally include an inductor and/or a capacitor. The internal configuration of the power amplifiers 11 and 12 is not limited to any particular configuration. For example, each of the power amplifiers 11 and 12 may be a multistage amplifier, differential amplifier, or Doherty amplifier.

The low-noise amplifier 21 is coupled between the filters 62 and 63 and the radio-frequency output terminal 121. The low-noise amplifier 21 is able to amplify receive signals in the bands A and B. Specifically, an input end of the low-noise amplifier 21 is coupleable to the filter 62 via the matching circuit 433, the switches 53 and 52, and the matching circuit 422. The input end of the low-noise amplifier 21 is coupleable to the filter 63 via the matching circuit 433, the switch 53, and the matching circuit 432. An output end of the low-noise amplifier 21 is coupled to the radio-frequency output terminal 121.

The low-noise amplifier 22 is coupled between the filters 65 and 66 and the radio-frequency output terminal 122. The low-noise amplifier 22 is able to amplify receive signals in the bands C and D. Specifically, an input end of the low-noise amplifier 22 is coupleable to the filter 65 via the matching circuit 463, the switches 55 and 54, and the matching circuit 452. The input end of the low-noise amplifier 22 is coupleable to the filter 66 via the matching circuit 463, the switch 55, and the matching circuit 462. An output end of the low-noise amplifier 22 is coupled to the radio-frequency output terminal 122.

The low-noise amplifiers 21 and 22 are electronic components for obtaining output signals with higher energy than input signals (receive signals), using power supplied from a power source. Each of the low-noise amplifiers 21 and 22 includes an amplifier transistor. Each of the low-noise amplifiers 21 and 22 may additionally include an inductor and/or a capacitor. The internal configuration of the low-noise amplifiers 21 and 22 is not limited to any particular configuration.

Each of the matching circuits 401, 411 to 413, 422, 431 to 433, 441 to 443, 452, and 461 to 463 is coupled between two circuit elements, operable to provide impedance matching between the two circuit elements. In other words, each of the matching circuits 401, 411 to 413, 422, 431 to 433, 441 to 443, 452, and 461 to 463 is an impedance matching circuit. Each of the matching circuits 401, 411 to 413, 422, 431 to 433, 441 to 443, 452, and 461 to 463 includes an inductor and may additionally include a capacitor.

The switch 51 is coupled between the antenna connection terminal 100 and the filters 61 to 66. The switch 51 has terminals 511 to 517. The terminal 511 is coupled to the antenna connection terminal 100. The terminal 512 is coupled to the filter 61 via the matching circuit 411. The terminal 513 is coupled to the filter 62. The terminal 514 is coupled to the filter 63 via the matching circuit 431. The terminal 515 is coupled to the filter 64 via the matching circuit 441. The terminal 516 is coupled to the filter 65. The terminal 517 is coupled to the filter 66 via the matching circuit 461.

With this connection configuration, the switch 51 is able to connect the terminal 511 to at least one of the terminals 512 to 517, based on, for example, a control signal from the RFIC 3. In other words, the switch 51 is able to control connection and disconnection between the antenna connection terminal 100 and each of the filters 61 to 66. The switch 51 is implemented by, for example, a multi-connection switching circuit. The switch 51 may be referred to as an antenna switch.

The switch 52 is coupled between the output end of the power amplifier 11 and the filters 61 and 62 and between the input end of the low-noise amplifier 21 and the filter 62. The switch 52 has terminals 521 to 524. The terminal 521 is coupled to the filter 61 via the matching circuit 412. The terminal 522 is coupled to the filter 62 via the matching circuit 422. The terminal 523 is coupled to the output end of the power amplifier 11 via the matching circuit 413. The terminal 524 is coupleable to the input end of the low-noise amplifier 21 via the switch 53 and the matching circuit 433.

With this connection configuration, the switch 52 is able to connect the terminal 523 to at least one of the terminals 521 and 522 and connect the terminal 522 to either the terminal 523 or 524, based on, for example, a control signal from the RFIC 3. In other words, the switch 52 is able to control connection and disconnection between the power amplifier 11 and each of the filters 61 and 62 and connect the filter 62 to the power amplifier 11 or the low-noise amplifier 21. The switch 52 is implemented by, for example, a multi-connection switching circuit.

The switch 53 is coupled between the input end of the low-noise amplifier 21 and the filters 62 and 63. The switch 53 has terminals 531 to 533. The terminal 531 is coupled to the input end of the low-noise amplifier 21 via the matching circuit 433. The terminal 532 is coupled to the terminal 524 of the switch 52. The terminal 532 is coupleable to the filter 62 via the switch 52 and the matching circuit 422. The terminal 533 is coupled to the filter 63 via the matching circuit 432.

With this connection configuration, the switch 53 is able to connect the terminal 531 to at least one of the terminals 532 and 533, based on, for example, a control signal from the RFIC 3. In other words, the switch 53 is able to control connection and disconnection between the low-noise amplifier 21 and each of the filters 62 and 63. The switch 53 is implemented by, for example, a multi-connection switching circuit.

The switch 54 is coupled between the output end of the power amplifier 12 and the filters 64 and 65 and between the input end of the low-noise amplifier 22 and the filter 65. The switch 54 has terminals 541 to 544. The terminal 541 is coupled to the filter 64 via the matching circuit 442. The terminal 542 is coupled to the filter 65 via the matching circuit 452. The terminal 543 is coupled to the output end of the power amplifier 12 via the matching circuit 443. The terminal 544 is coupleable to the input end of the low-noise amplifier 22 via the switch 55 and the matching circuit 463.

With this connection configuration, the switch 54 is able to connect the terminal 543 to at least one of the terminals 541 and 542 and connect the terminal 542 to the terminal 543 or 544, based on, for example, a control signal from the RFIC 3. In other words, the switch 54 is able to control connection and disconnection between the power amplifier 12 and each of the filters 64 and 65 and connect the filter 65 to the power amplifier 12 or the low-noise amplifier 22. The switch 54 is implemented by, for example, a multi-connection switching circuit.

The switch 55 is coupled between the input end of the low-noise amplifier 22 and the filters 65 and 66. The switch 55 has terminals 551 to 553. The terminal 551 is coupled to the input end of the low-noise amplifier 22 via the matching circuit 463. The terminal 552 is coupled to the terminal 544 of the switch 54. The terminal 552 is coupleable to the filter 65 via the switch 54 and the matching circuit 452. The terminal 553 is coupled to the filter 66 via the matching circuit 462.

With this connection configuration, the switch 55 is able to connect the terminal 551 to at least one of the terminals 552 and 553, based on, for example, a control signal from the RFIC 3. In other words, the switch 55 is able to control connection and disconnection between the low-noise amplifier 22 and each of the filters 65 and 66. The switch 55 is implemented by, for example, a multi-connection switching circuit.

The filter 61 (A-Tx) is an example of a first filter. The filter 61 is coupled between the power amplifier 11 and the antenna connection terminal 100. Specifically, one end of the filter 61 is coupleable to the antenna connection terminal 100 via the matching circuit 411, the switch 51, and the matching circuit 401. The other end of the filter 61 is coupleable to the output end of the power amplifier 11 via the matching circuit 412, the switch 52, and the matching circuit 413. The filter 61 has a pass band including an uplink operation band corresponding to the band A for frequency division duplex (FDD), and the filter 61 is able to pass transmit signals in the band A.

The filter 62 (B-TRx) is an example of a third filter. The filter 62 is coupled between the antenna connection terminal 100 and the power amplifier 11 and between the antenna connection terminal 100 and the low-noise amplifier 21. Specifically, one end of the filter 62 is coupleable to the antenna connection terminal 100 via the switch 51 and the matching circuit 401. The other end of the filter 62 is coupleable to the output end of the power amplifier 11 via the matching circuit 422, the switch 52, and the matching circuit 413. The other end of the filter 62 is also coupleable to the input end of the low-noise amplifier 21 via the matching circuit 422, the switches 52 and 53, and the matching circuit 433. The filter 62 has a pass band including the band B for time division duplex (TDD), and the filter 62 is able to pass transmit signals and receive signals in the band B.

The filter 63 (A-Rx) is an example of a second filter. The filter 63 is coupled between the low-noise amplifier 21 and the antenna connection terminal 100. Specifically, one end of the filter 63 is coupleable to the antenna connection terminal 100 via the matching circuit 431, the switch 51, and the matching circuit 401. The other end of the filter 63 is coupleable to the input end of the low-noise amplifier 21 via the matching circuit 432, the switch 53, and the matching circuit 433. The filter 63 has a pass band including a downlink operation band corresponding to the band A for FDD, and the filter 63 is able to pass receive signals in the band A.

The filter 64 (C-Tx) is an example of the first filter. The filter 64 is coupled between the power amplifier 12 and the antenna connection terminal 100. Specifically, one end of the filter 64 is coupleable to the antenna connection terminal 100 via the matching circuit 441, the switch 51, and the matching circuit 401. The other end of the filter 64 is coupleable to the output end of the power amplifier 12 via the matching circuit 442, the switch 54, and the matching circuit 443. The filter 64 has a pass band including an uplink operation band corresponding to the band C for FDD, and the filter 64 is able to pass transmit signals in the band C.

The filter 65 (D-TRx) is an example of the third filter. The filter 65 is coupled between the antenna connection terminal 100 and the power amplifier 12 and between the antenna connection terminal 100 and the low-noise amplifier 22. Specifically, one end of the filter 65 is coupleable to the antenna connection terminal 100 via the switch 51 and the matching circuit 401. The other end of the filter 65 is coupleable to the output end of the power amplifier 12 via the matching circuit 452, the switch 54, and the matching circuit 443. The other end of the filter 65 is also coupleable to the input end of the low-noise amplifier 22 via the matching circuit 452, the switches 54 and 55, and the matching circuit 463. The filter 65 has a pass band including the band D for TDD, and the filter 65 is able to pass transmit signals and receive signals in the band D.

The filter 66 (C-Rx) is an example of a second filter. The filter 66 is coupled between the low-noise amplifier 22 and the antenna connection terminal 100. Specifically, one end of the filter 66 is coupleable to the antenna connection terminal 100 via the matching circuit 461, the switch 51, and the matching circuit 401. The other end of the filter 66 is coupleable to the input end of the low-noise amplifier 22 via the matching circuit 462, the switch 55, and the matching circuit 463. The filter 66 has a pass band including a downlink operation band corresponding to the band C for FDD, and the filter 66 is able to pass receive signals in the band C.

The PA controller 71 is able to control the power amplifiers 11 and 12. The PA controller 71 is operable to receive a digital control signal from the RFIC 3 via the control terminal 131 and output control signals to the power amplifiers 11 and 12.

The bands A to D represent frequency bands for a communication system established by a radio access technology (RAT). The bands A to D are defined, for example, by a standards organization (the 3rd Generation Partnership Project (3GPP), the Institute of Electrical and Electronics Engineers (IEEE), or other entities). Examples of the communication system include a 5th Generation New Radio (5GNR) system, a Long Term Evolution (LTE) system, and a wireless local area network (WLAN) system.

The bands A and B may belong to a band group different from the band group including the bands C and D, or the bands A and B may belong to the same band group as the bands C and D. As used herein, a band group refers to a frequency range including multiple bands. For example, an ultra high-band group (3300-5000 MHz), a high-band group (2300-2690 MHz), a mid-band group (1427-2200 MHz), or a low-band group (698-960 MHz) can be used as a band group, but these are not to be interpreted as limiting. For example, a band group including unlicensed bands of 5 gigahertz or higher or a band group corresponding to millimeter-wave bands can be used as a band group.

For example, the bands A and B may belong to the high-band group, and the bands C and D may belong to the mid-band group. Alternatively, for example, the bands A and B may belong to the mid-band group or the high-band group, and the bands C and D may belong to the low-band group.

The radio-frequency circuit 1 illustrated in FIG. 1 is merely an example, and this is not to be interpreted as limiting. For example, the bands that the radio-frequency circuit 1 supports are not limited to the bands A to D. For example, the radio-frequency circuit 1 may support five or more bands. In this case, the radio-frequency circuit 1 may include filters for bands E, F, G, and beyond. For example, the radio-frequency circuit 1 may support only the bands A and B without responding to the bands C and D. In this case, the radio-frequency circuit 1 does not need to include the power amplifier 12, the low-noise amplifier 22, the matching circuits 441 to 443, 452, and 461 to 463, the radio-frequency input terminal 112, and the radio-frequency output terminal 122. For example, the radio-frequency circuit 1 may be a dedicated transmit circuit. In this case, the radio-frequency circuit 1 does not need to include the low-noise amplifiers 21 and 22, the matching circuits 431 to 433 and 461 to 463, the switches 53 and 55, the filters 63 and 66, and the radio-frequency output terminals 121 and 122. For example, the radio-frequency circuit 1 may be a dedicated receive circuit. In this case, the radio-frequency circuit 1 does not need to include the power amplifiers 11 and 12, the matching circuits 411 to 413 and 441 to 443, the switches 52 and 54, the filters 61 and 64, and the radio-frequency input terminals 111 and 112.

It may be possible that the radio-frequency circuit 1 does not include some of the matching circuits 401, 411 to 413, 422, 431 to 433, 441 to 443, 452, and 461 to 463. For example, the radio-frequency circuit 1 may be coupled to multiple antennas, and the radio-frequency circuit 1 may include multiple antenna connection terminals. The radio-frequency circuit 1 may include more radio-frequency input terminals. In this case, a switch for controlling connection between a power amplifier and the radio-frequency input terminals may be inserted between the power amplifier and the radio-frequency input terminals. The radio-frequency circuit 1 may include more radio-frequency output terminals. In this case, a switch for controlling connection between a low-noise amplifier and the radio-frequency output terminals may be inserted between the low-noise amplifier and the radio-frequency output terminals.

2 Practical Examples of Radio-Frequency Circuit 1

2.1 First Practical Example

As a first practical example of the radio-frequency circuit 1 according to the embodiment described above, a radio-frequency module 1A including the radio-frequency circuit 1 will be described with reference to FIGS. 2 to 5.

2.1.1 Component Arrangement of Radio-Frequency Module 1A

Figure 2:
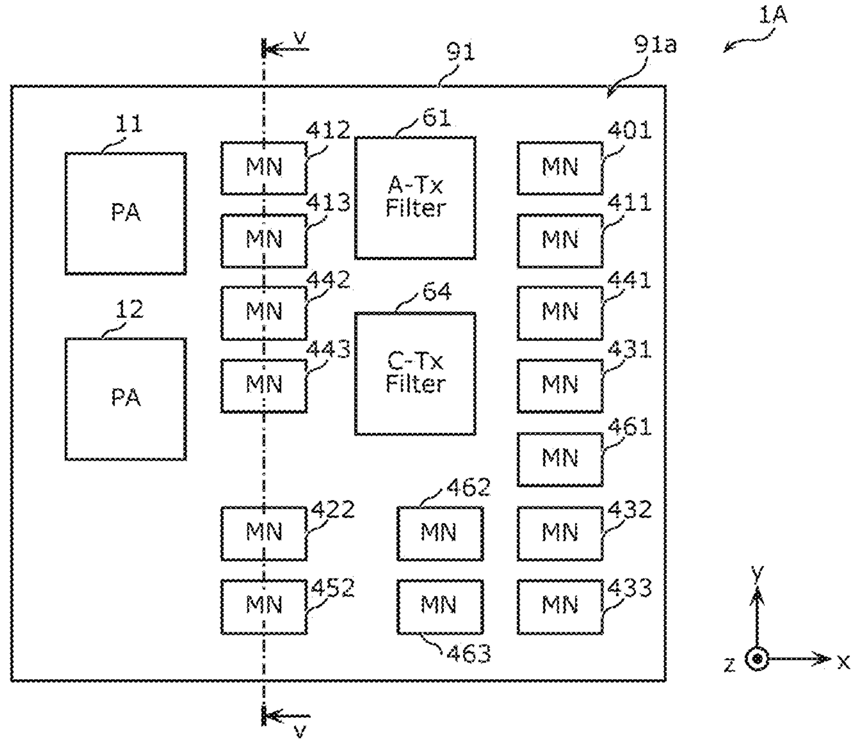
FIG. 2 is a plan view of a first major surface of a radio-frequency module according to a first practical example.
Figure 3:
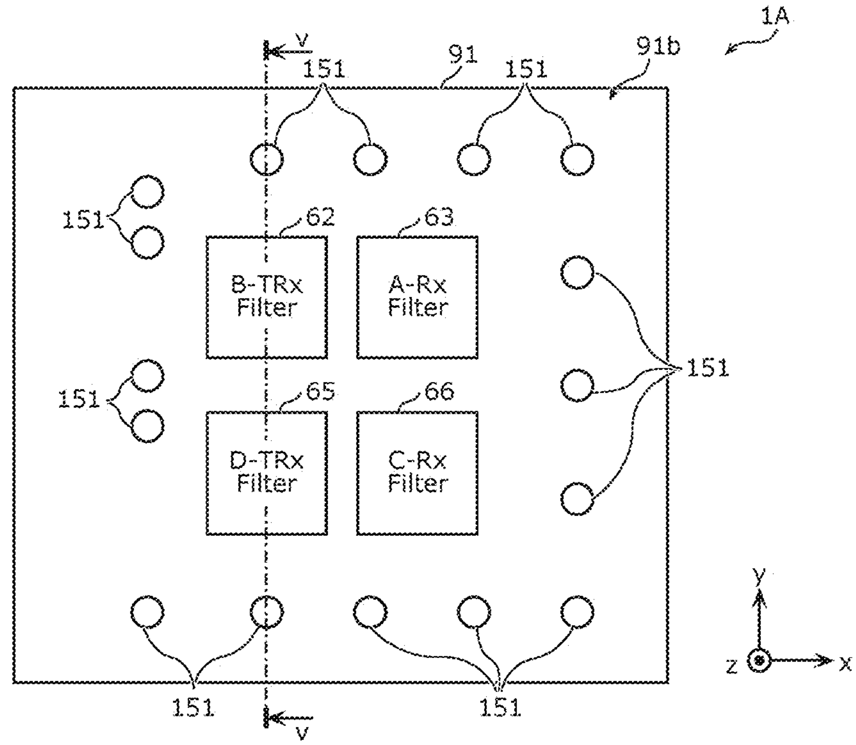
FIG. 3 is a plan view of a second major surface of the radio-frequency module according to the first practical example.
Figure 4:
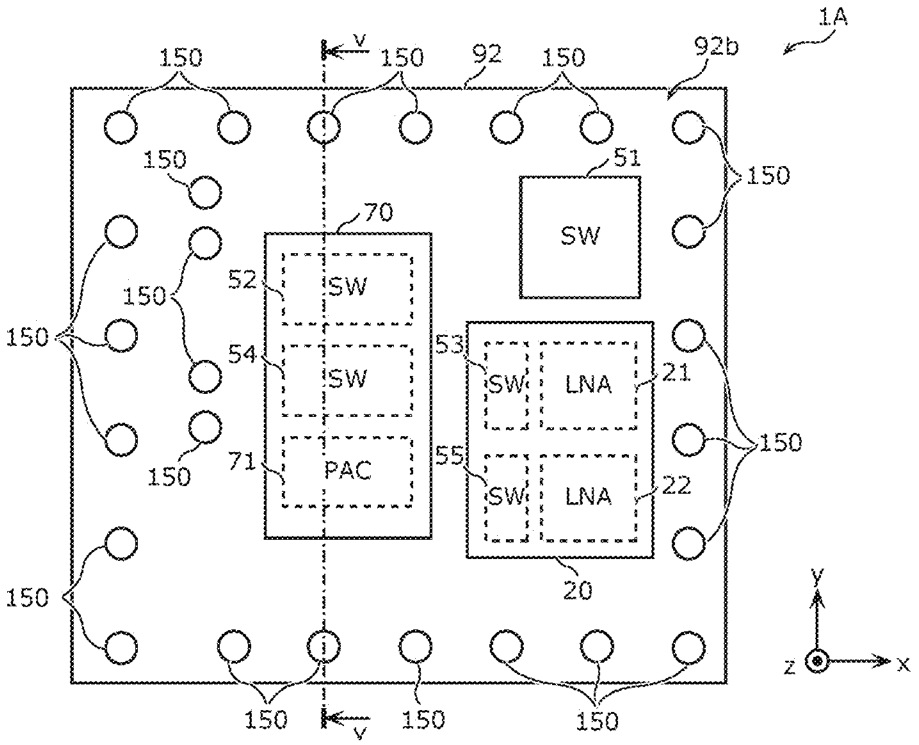
FIG. 4 is a plan view of a fourth major surface of the radio-frequency module according to the first practical example.
Figure 5:
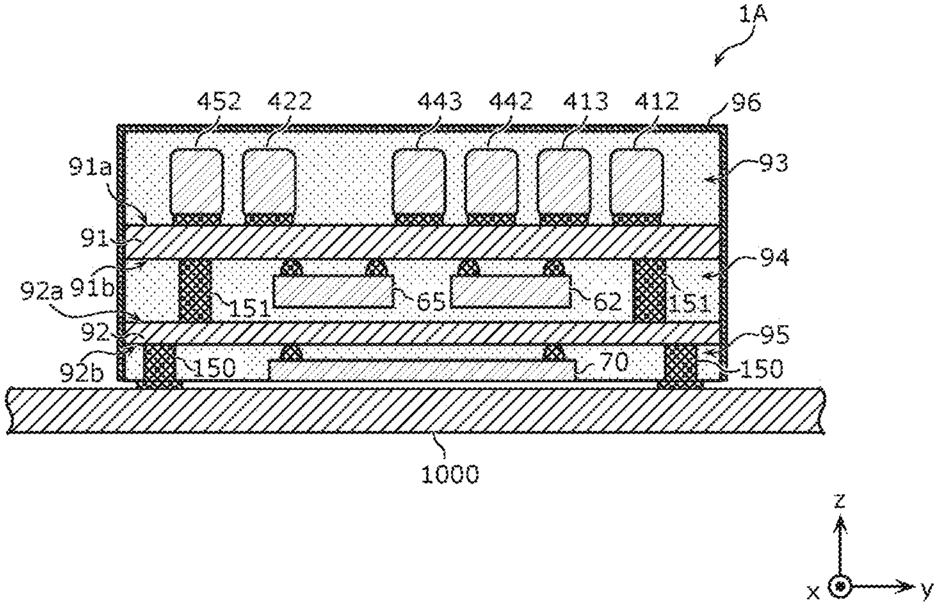
FIG. 5 is a sectional view of the radio-frequency module according to the first practical example.

FIG. 2 is a plan view of a major surface 91*a* of the radio-frequency module 1A according to this practical example. FIG. 3 is a plan view of a major surface 91*b* of a module substrate 91 of the radio-frequency module 1A according to this practical example, under a condition the major surface 91*b* side is viewed through the module substrate 91 from the positive side of the z axis. FIG. 4 is a plan view of a major surface 92*b* of a module substrate 92 of the radio-frequency module 1A according to this practical example, under a condition the major surface 92*b* side is viewed through the module substrate 92 from the positive side of the z axis. FIG. 5 is a sectional view of the radio-frequency module 1A according to this practical example. The section plane of the radio-frequency module 1A in FIG. 5 is taken along line v-v in FIGS. 2 to 4.

FIGS. 2 to 5 do not illustrate interconnections connecting electronic components disposed at the module substrates 91 and 92. FIGS. 2 to 4 also do not illustrate resin members 93 to 95 that cover electronic components and a shield electrode layer 96 that cover surfaces of the resin members 93 to 95.

The radio-frequency module 1A includes, as well as multiple electronic components including the circuit elements illustrated in FIG. 1, the module substrates 91 and 92, the resin members 93 to 95, the shield electrode layer 96, multiple external connection terminals 150, and multiple inter-substrate connection terminals 151.

The module substrate 91 is an example of a first module substrate. The module substrate 91 has the major surfaces 91*a* and 91*b* that are opposite to each other. The major surface 91*a* is an example of a first major surface, and the major surface 91*b* is an example of a second major surface.

The module substrate 92 is an example of a second module substrate. The module substrate 92 has major surfaces 92*a* and 92*b* that are opposite to each other. The major surface 92*a* is an example of a third major surface, and the major surface 92*b* is an example of a fourth major surface.

The module substrates 91 and 92 are positioned such that the major surface 91*b* of the module substrate 91 faces the major surface 92*a* of the module substrate 92. The module substrates 91 and 92 are separated by a distance sufficient to accommodate electronic components between the major surfaces 91*b* and 92*a*. The electronic components are disposed at the two module substrates 91 and 92. Specifically, the electronic components are arranged in three tiers: one tier between the major surfaces 91*b* and 92*a*, another tier above the major surface 91*a*, and still another tier below the major surface 92*b*.

In FIGS. 2 to 5, the module substrates 91 and 92 have a rectangular shape of the same size in plan view, but the module substrates 91 and 92 may be different from each other with respect to size and/or shape. The module substrates 91 and 92 are not necessarily rectangular.

As the module substrates 91 and 92, for example, a substrate having a layered structure including multiple dielectric layers such as a low temperature co-fired ceramic (LTCC) substrate, a high temperature co-fired ceramic (HTCC) substrate, a component-embedded substrate, a substrate including a redistribution layer (RDL), or a printed-circuit board is usable, but these are not to be interpreted as limiting.

At the major surface 91*a* (an upper tier), the power amplifiers 11 and 12, the matching circuits 401, 411 to 413, 422, 431 to 433, 441 to 443, 452, and 461 to 463, and the filters 61 and 64 are disposed.

Each of the power amplifiers 11 and 12 is an example of a first electronic component including at least a transistor. The power amplifiers 11 and 12 are made using, for example, complementary metal oxide semiconductor (CMOS). Specifically, the power amplifiers 11 and 12 may be manufactured using a silicon on insulator (SOI) process. In this manner, the power amplifiers 11 and 12 can be manufactured with low costs. The power amplifiers 11 and 12 may be made of at least one of gallium arsenide (GaAs), silicon germanium (SiGe), and gallium nitride (GaN). In this manner, the power amplifiers 11 and 12 can be implemented to a high degree of quality. The semiconductor material of the power amplifiers 11 and 12 is not limited to the materials presented above.

Each of the matching circuits 401, 411 to 413, 422, 431 to 433, 441 to 443, 452, and 461 to 463 is an example of a second electronic component not including any transistor. Each of the matching circuits 401, 411 to 413, 422, 431 to 433, 441 to 443, 452, and 461 to 463 is implemented by a chip inductor. The chip inductor is a surface mount device (SMD) that forms an inductor. The chip inductors are disposed at the major surface 91*a*, but not between the major surfaces 91*b* and 92*a* or below the major surface 92*b*. In other words, the chip inductors are disposed only in the upper tier among the three tiers.

The matching circuits may include chip capacitors as well as chip inductors. The disposition of the chip capacitors is not limited to any particular manner. It may be possible that one or some of the matching circuits are not surface-mounted. For example, an inductor and/or a capacitor included in the matching circuits may be formed inside the module substrate 91 and/or the module substrate 92.

The filters 61 and 64 may be implemented by, but not limited to, for example, surface acoustic wave (SAW) filters, bulk acoustic wave (BAW) filters, LC resonance filters, or dielectric filters.

The resin member 93 covers the major surface 91*a* and the electronic components disposed at the major surface 91*a*. The resin member 93 functions to secure the reliability of mechanical strength, moisture resistance, and other properties of the electronic components disposed at the major surface 91*a*. The resin member 93 is, however, not necessarily included in the radio-frequency module 1A.

Between the major surfaces 91*b* and 92*a* (a middle tier), the filters 62, 63, 65, and 66 and the inter-substrate connection terminals 151 are disposed. The resin member 94 is interposed between the major surfaces 91*b* and 92*a*. The resin member 94 covers the electronic components disposed between the major surfaces 91*b* and 92*a*.

Each of the filters 62, 63, 65, and 66 is an example of the second electronic component not including any transistor. The filters 62, 63, 65, and 66 may be implemented by, but not limited to, for example, SAW filters, BAW filters, LC resonance filters, or dielectric filters.

Each of the electronic components disposed between the major surfaces 91*b* and 92*a* (the filters 62, 63, 65, and 66 in this example) is electrically coupled to the module substrate 91 through electrodes provided on the side facing the module substrate 91.

The inter-substrate connection terminals 151 are electrodes for electrically coupling the module substrates 91 and 92. Some of the inter-substrate connection terminals 151, which coincide with the power amplifiers 11 and 12 in plan view, are coupled to the external connection terminals 150 and serve as heat dissipating electrodes for the power amplifiers 11 and 12. For example, copper post electrodes are used as the inter-substrate connection terminals 151, but this is not to be interpreted as limiting the shape and material of the inter-substrate connection terminals 151.

The resin member 94 covers the major surfaces 91*b* and 92*a* and the electronic components between the major surfaces 91*b* and 92*a*. The resin member 94 functions to secure the reliability of mechanical strength, moisture resistance, and other properties of the electronic components between the major surfaces 91*b* and 92*a*. The resin member 94 is, however, not necessarily included in the radio-frequency module 1A.

At the major surface 92*b* (a lower tier), integrated circuits 20 and 70, the switch 51, and the external connection terminals 150 are disposed.

Each of the integrated circuits 20 and 70 is an example of the first electronic component including at least a transistor. The integrated circuit 20 includes the low-noise amplifiers 21 and 22 and the switches 53 and 55. The circuit elements that constitute the low-noise amplifiers 21 and 22 and the switches 53 and 55 are formed at a circuit plane of the integrated circuit 20. For example, a major surface facing the module substrate 92 of the integrated circuit 20 is used as the circuit plane. The integrated circuit 70 includes the switches 52 and 54 and the PA controller 71. The circuit elements that constitute the switches 52 and 54 and the PA controller 71 are formed at a circuit plane of the integrated circuit 70. For example, a major surface facing the module substrate 92 of the integrated circuit 70 is used as the circuit plane.

The integrated circuit 20 and/or the integrated circuit 70 may be made using, for example, CMOS. Specifically, the integrated circuit 20 and/or the integrated circuit 70 may be manufactured using an SOI process. The integrated circuit 20 and/or the integrated circuit 70 may be made of at least one of GaAs, SiGe, and GaN. The semiconductor material of the integrated circuits 20 and 70 is not limited to the materials presented above.

The switch 51 is an example of the first electronic component including at least a transistor. The circuit elements that constitute the switch 51 is formed at a circuit plane of a switch device. For example, a major surface facing the module substrate 92 of the switch device is used as the circuit plane. The switch 51 may be made using, for example, CMOS. Specifically, the switch 51 may be manufactured using an SOI process. The switch 51 may be made of at least one of GaAs, SiGe, and GaN. The semiconductor material of the switch 51 is not limited to the materials presented above. The switch 51 may be included in the integrated circuit 20.

As described above, at the major surface 92*b*, the first electronic component including at least a transistor (the integrated circuits 20 and 70 and the switch 51 in this example) is disposed, but the second electronic component not including any transistor (the filters 61 to 66 and the matching circuits (chip inductors) 401, 411 to 413, 422, 431 to 433, 441 to 443, 452, and 461 to 463 in this example) is not disposed. Overall, at the major surface 92*b*, only the first electronic component among the multiple electronic components is disposed. With this configuration, the lower surface of the radio-frequency module 1A can be thinned such that the thickness of each of the resin member 95, the integrated circuits 20 and 70, and the switch 51 is reduced.

The external connection terminals 150 include a ground terminal as well as the antenna connection terminal 100, the radio-frequency input terminals 111 and 112, the radio-frequency output terminals 121 and 122, and the control terminal 131, which are illustrated in FIG. 1. The individual external connection terminals 150 are joined to, for example, an input-output terminal and/or a ground terminal at a motherboard 1000 provided on the negative direction side of the z axis from the radio-frequency module 1A. For example, copper post electrodes can be used as the external connection terminals 150, but this is not to be interpreted as limiting the shape and material of the external connection terminals 150. Some of the external connection terminals 150, which coincide with the power amplifiers 11 and 12 in plan view, serve as heat dissipating electrodes for the power amplifiers 11 and 12 in cooperation with the inter-substrate connection terminals 151 coupled to the power amplifiers 11 and 12.

The resin member 95 covers the major surface 92*b* and the electronic components disposed at the major surface 92*b*. The resin member 95 functions to secure the reliability of mechanical strength, moisture resistance, and other properties of the electronic components disposed at the major surface 92*b*. The resin member 95 is, however, not necessarily included in the radio-frequency module 1A.

The shield electrode layer 96 is, for example, a thin metal film formed using a sputtering method. The shield electrode layer 96 covers the upper surface of the resin member 93 and the side surfaces of the resin members 93 to 95 and the module substrates 91 and 92. The shield electrode layer 96 is grounded to inhibit exterior noise from intruding into the electronic components constituting the radio-frequency module 1A. The shield electrode layer 96 is, however, not necessarily included in the radio-frequency module 1A.

2.1.2 Effects of Radio-Frequency Module 1A

As described above, the radio-frequency module 1A according to this practical example includes the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include one or more first electronic components each including at least a transistor and one or more second electronic components each not including any transistor. At the major surface 92*b*, at least one of the one or more first electronic components is disposed, and the one or more second electronic components are not disposed.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1A in plan view is decreased; in other words, the size of the radio-frequency module 1A is reduced. Furthermore, only the first electronic component, which has a relatively low profile among the multiple electronic components, is disposed at the major surface 92*b*. This configuration reduces the thickness of the lower tier of the radio-frequency module 1A, consequently lowering the profile of the radio-frequency module 1A. In particular, by thinning the electronic components disposed at the major surface 92*b* and the resin member 95, the thickness of the lower tier can be further reduced.

For example, it may be possible that in the radio-frequency module 1A according to this practical example, the one or more second electronic components include multiple chip inductors (the matching circuits 401, 411 to 413, 422, 431 to 433, 441 to 443, 452, and 461 to 463 in this practical example), and the multiple chip inductors are disposed at the major surface 91*a*, not disposed between the major surfaces 91*b* and 92*a* or at the major surface 92*b*.

In this configuration, the chip inductors, which have relatively high profiles among the multiple electronic components, are all disposed at the major surface 91*a* (the upper tier). As a result, the thickness of two tiers (the middle tier and the lower tier) without chip inductors can be reduced, and the profile of the radio-frequency module 1A can be consequently lowered.

For example, it may be possible that in the radio-frequency module 1A according to this practical example, the one or more first electronic components include the low-noise amplifier 21 and/or the low-noise amplifier 22, and the low-noise amplifier 21 and/or the low-noise amplifier 22 is disposed at the major surface 92*b*. For example, it may be possible that in the radio-frequency module 1A according to this practical example, the one or more first electronic components include the power amplifier 11 and/or the power amplifier 12, and the power amplifier 11 and/or the power amplifier 12 is disposed at the major surface 91*a*. For example, it may be possible that in the radio-frequency module 1A according to this practical example, the one or more first electronic components include the PA controller 71 for controlling the power amplifier 11 and/or the power amplifier 12, and the PA controller 71 is disposed at the major surface 92*b*. For example, it may be possible that in the radio-frequency module 1A according to this practical example, the one or more second electronic components include the filter 61 and/or the filter 64 coupled to the power amplifier 11 and/or the power amplifier 12, and the filter 61 and/or the filter 64 is disposed at the major surface 91*a*. For example, it may be possible that in the radio-frequency module 1A according to this practical example, the one or more second electronic components include the filter 63 and/or the filter 66 coupled to the low-noise amplifier 21 and/or the low-noise amplifier 22, and the filter 63 and/or the filter 66 is disposed between the major surfaces 91*b* and 92*a*. For example, it may be possible that in the radio-frequency module 1A according to this practical example, the one or more second electronic components include the power amplifier 11 and/or the power amplifier 12, and the filter 62 and/or the filter 64 coupled to the low-noise amplifier 21 and/or the low-noise amplifier 22, and the filter 62 and/or the filter 64 is disposed between the major surfaces 91*b* and 92*a*.

In this configuration, only the first electronic component is disposed in the lower tier, and the other electronic components are disposed in the other two tiers in a well-balanced manner. As a result, the radio-frequency module 1A achieves a reduced size without increasing the height.

The radio-frequency module 1A according to this practical example includes the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed at the major surface 91*a*, but not between the major surfaces 91*b* and 92*a* or at the major surface 92*b*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1A in plan view is decreased; in other words, the size of the radio-frequency module 1A is reduced. The chip inductors, which have relatively high profiles among the multiple electronic components, are all disposed at the major surface 91*a* (the upper tier). As a result, the thickness of two tiers (the middle tier and the lower tier) without chip inductors can be reduced, and the profile of the radio-frequency module 1A can be consequently lowered.

The communication device 5 according to this practical example includes the RFIC 3 configured to process a radio-frequency signal and the radio-frequency module 1A configured to transfer the radio-frequency signal between the RFIC 3 and the antenna 2.

This configuration enables the communication device 5 to achieve effects of the radio-frequency module 1A.

2.2 Second Practical Example

Next, as a second practical example of the radio-frequency circuit 1 according to the embodiment described above, a radio-frequency module 1B including the radio-frequency circuit 1 will be described. This practical example differs from the first practical example mainly in that at least one matching circuit is implemented by an integrated passive device (IPD). The following describes the radio-frequency module 1B according to this practical example with reference to FIGS. 6 to 9, with a main focus on points different from the first practical example.

2.2.1 Component Arrangement of Radio-Frequency Module 1B

Figure 6:
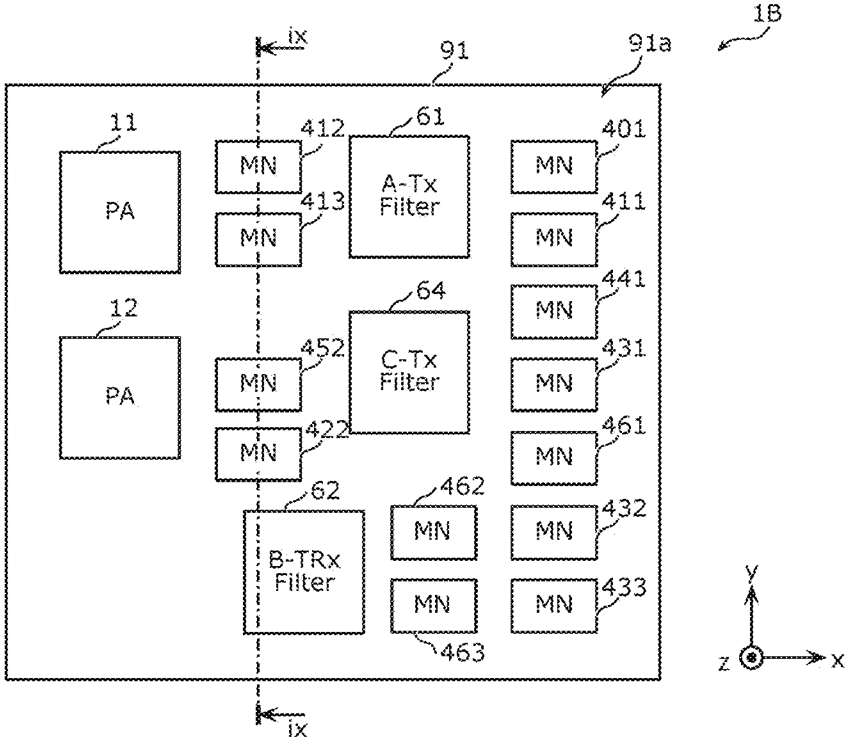
FIG. 6 is a plan view of a first major surface of a radio-frequency module according to a second practical example.
Figure 7:
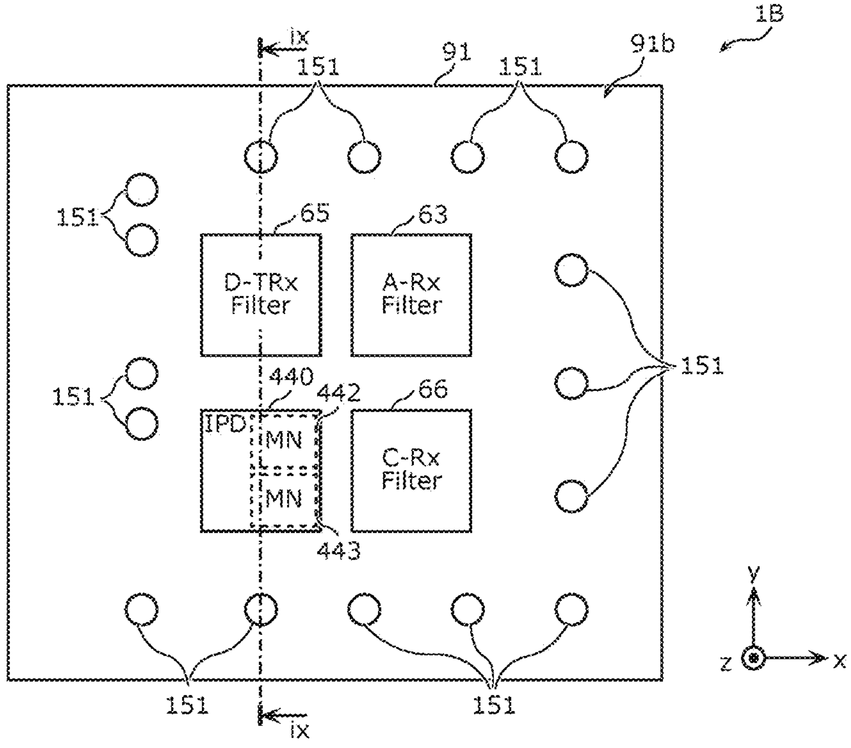
FIG. 7 is a plan view of a second major surface of the radio-frequency module according to the second practical example.
Figure 8:
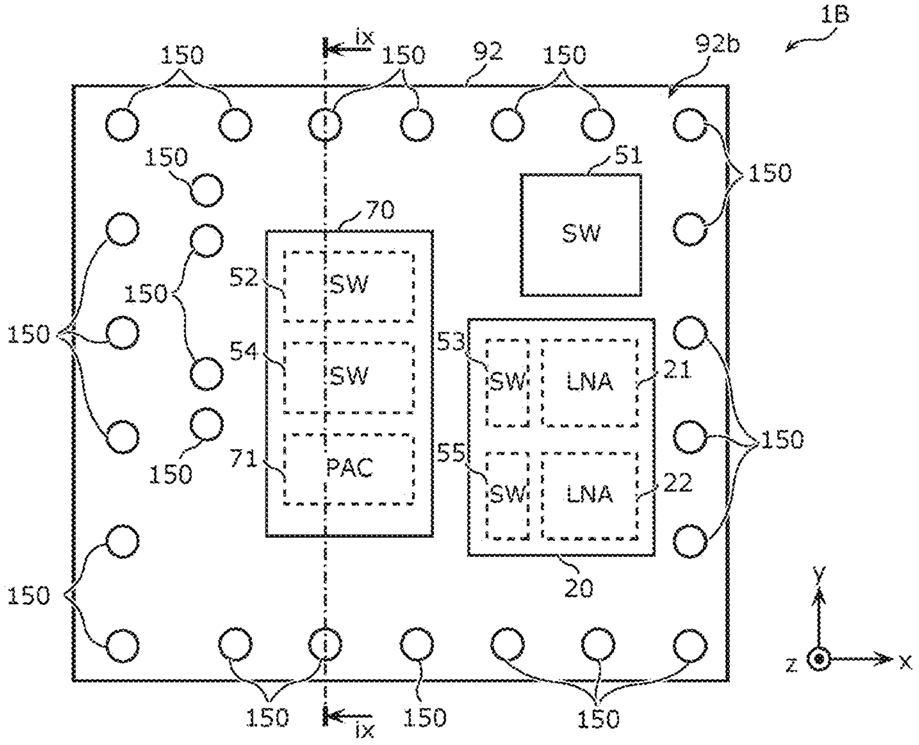
FIG. 8 is a plan view of a fourth major surface of the radio-frequency module according to the second practical example.
Figure 9:
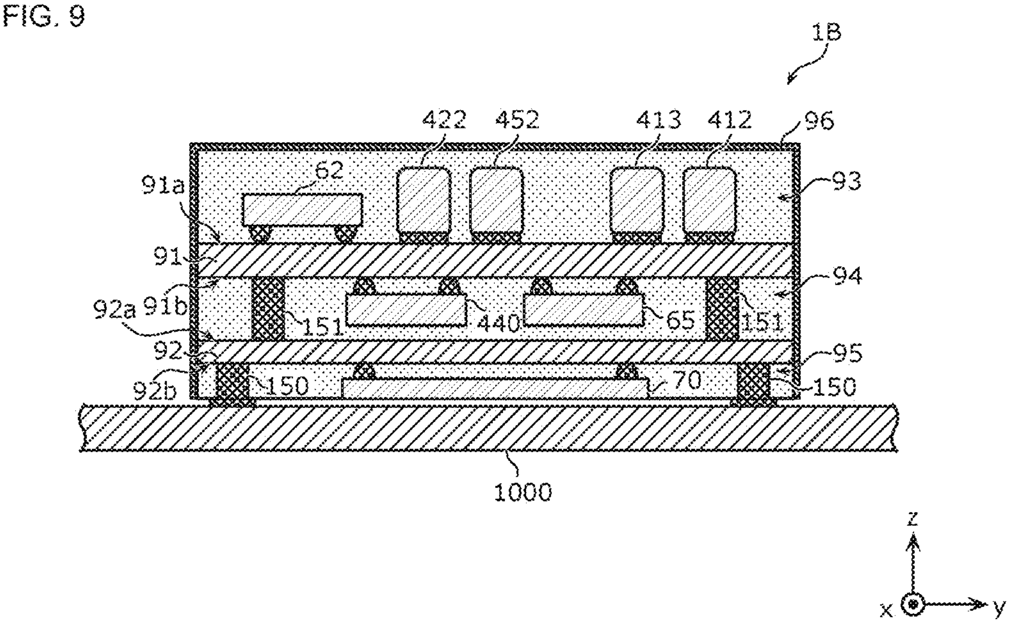
FIG. 9 is a sectional view of the radio-frequency module according to the second practical example.

FIG. 6 is a plan view of a major surface 91*a* of the radio-frequency module 1B according to this practical example. FIG. 7 is a plan view of a major surface 91*b* of a module substrate 91 of the radio-frequency module 1B according to this practical example, under a condition the major surface 91*b* side is viewed through the module substrate 91 from the positive side of the z axis. FIG. 8 is a plan view of a major surface 92*b* of a module substrate 92 of the radio-frequency module 1B according to this practical example, under a condition the major surface 92*b* side is viewed through the module substrate 92 from the positive side of the z axis. FIG. 9 is a sectional view of the radio-frequency module 1B according to this practical example. The section plane of the radio-frequency module 1B in FIG. 9 is taken along line ix-ix in FIGS. 6 to 8.

At the major surface 91*a* (an upper tier), the power amplifiers 11 and 12, the matching circuits (chip inductors) 401, 411 to 413, 422, 431 to 433, 441, 452, and 461 to 463, and the filters 61, 62 and 64 are disposed. In other words, in this practical example, the filter 62 is disposed at the major surface 91*a* instead of the matching circuits 442 and 443.

The chip inductors (the matching circuits 401, 411 to 413, 422, 431 to 433, 441, 452, and 461 to 463) are disposed at the major surface 91*a*. No chip inductor is disposed between the major surfaces 91*b* and 92*a* and at the major surface 92*b*. In other words, the chip inductors are disposed only in the upper tier among the three tiers.

Between the major surfaces 91*b* and 92*a* (a middle tier), the filters 63, 65, and 66, an IPD 440, and the inter-substrate connection terminals 151 are disposed. In other words, in this practical example, the IPD 440 is disposed between the major surfaces 91*b* and 92*a* instead of the filter 62. The IPD 440 is an example of the second electronic component not including a transistor. The IPD 440 includes the matching circuits 442 and 443.

Similarly to the first practical example, at the major surface 92*b* (a lower tier), the integrated circuits 20 and 70, the switch 51, and the external connection terminals 150 are disposed. This means that at the major surface 92*b*, the first electronic component including at least a transistor (the integrated circuits 20 and 70 and the switch 51 in this example) is disposed, but the second electronic component not including any transistor (the matching circuits 401, 411 to 413, 422, 431 to 433, 441 to 443, 452, and 461 to 463, and the filters 61 to 66 in this example) is not disposed. In other words, at the major surface 92*b*, only the first electronic component among the multiple electronic components is disposed.

2.2.2 Effects of Radio-Frequency Module 1B

As described above, the radio-frequency module 1B according to this practical example includes, similarly to the radio-frequency module 1A according to the first practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include one or more first electronic components each including at least a transistor and one or more second electronic components each not including any transistor. At the major surface 92*b*, at least one of the one or more first electronic components is disposed, and the one or more second electronic components are not disposed.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1B in plan view is decreased; in other words, the size of the radio-frequency module 1B is reduced. Furthermore, only the first electronic component, which has a relatively low profile among the multiple electronic components, is disposed at the major surface 92*b*. This configuration reduces the thickness of the lower tier of the radio-frequency module 1B, consequently lowering the profile of the radio-frequency module 1B. In particular, by thinning the electronic components disposed at the major surface 92*b* and the resin member 95, the thickness of the lower tier can be further reduced.

For example, it may be possible that in the radio-frequency module 1B according to this practical example, the one or more second electronic components include the IPD 440, and the IPD 440 is disposed between the major surfaces 91*b* and 92*a*.

In this configuration, in the radio-frequency module 1B, the matching circuits 442 and 443 are implemented by the IPD 440, which has a lower profile than chip inductors. This configuration consequently lowers the profile of the radio-frequency module 1B.

The radio-frequency module 1B according to this practical example includes, similarly to the radio-frequency module 1A according to the first practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed at the major surface 91*a*. No chip inductor is disposed between the major surfaces 91*b* and 92*a* and at the major surface 92*b*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1B in plan view is decreased; in other words, the size of the radio-frequency module 1B is reduced. The chip inductors, which have relatively high profiles among the multiple electronic components, are all disposed at the major surface 91*a* (the upper tier). As a result, the thickness of two tiers (the middle tier and the lower tier) without chip inductors can be reduced, and the profile of the radio-frequency module 1B can be consequently lowered.

The communication device 5 according to this practical example includes the RFIC 3 configured to process a radio-frequency signal and the radio-frequency module 1B configured to transfer the radio-frequency signal between the RFIC 3 and the antenna 2.

This configuration enables the communication device 5 to achieve effects of the radio-frequency module 1B.

2.3 Third Practical Example

Next, as a third practical example of the radio-frequency circuit 1 according to the embodiment described above, a radio-frequency module 1C including the radio-frequency circuit 1 will be described. This practical example differs from the practical examples described above in the disposition of the integrated circuit 70. The following describes the radio-frequency module 1C according to this practical example with reference to FIGS. 10 to 13, with a main focus on points different from the practical examples describe above.

2.3.1 Component Arrangement of Radio-Frequency Module 1C

Figure 10:
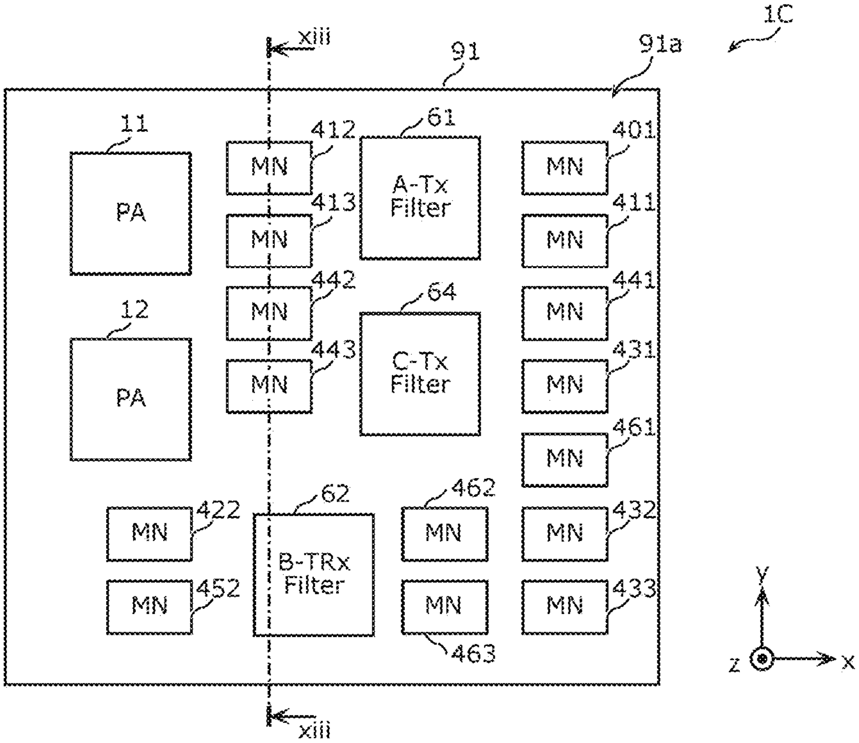
FIG. 10 is a plan view of a first major surface of a radio-frequency module according to a third practical example.
Figure 11:
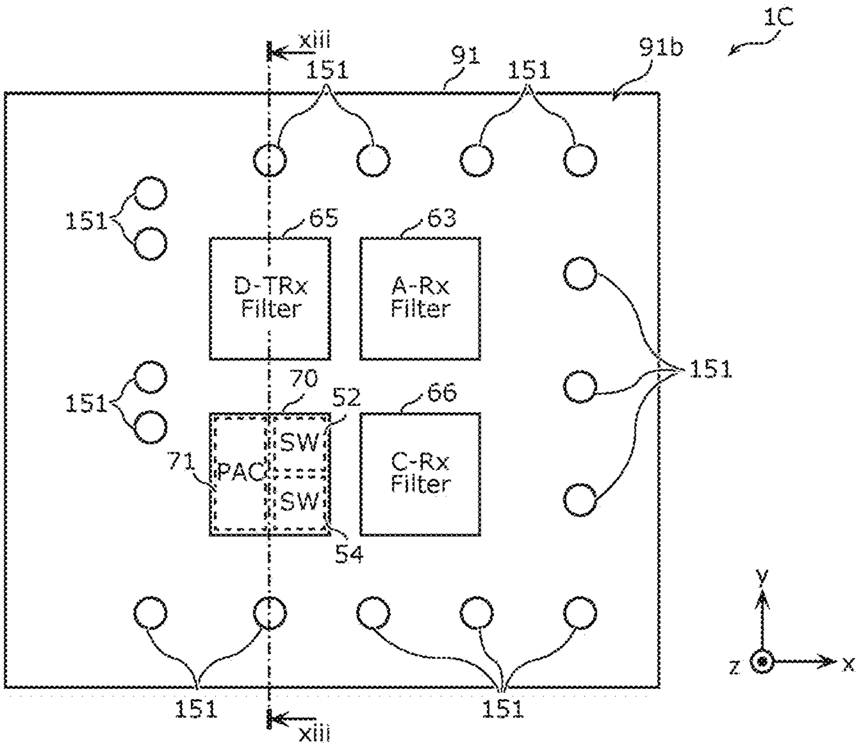
FIG. 11 is a plan view of a second major surface of the radio-frequency module according to the third practical example.
Figure 12:
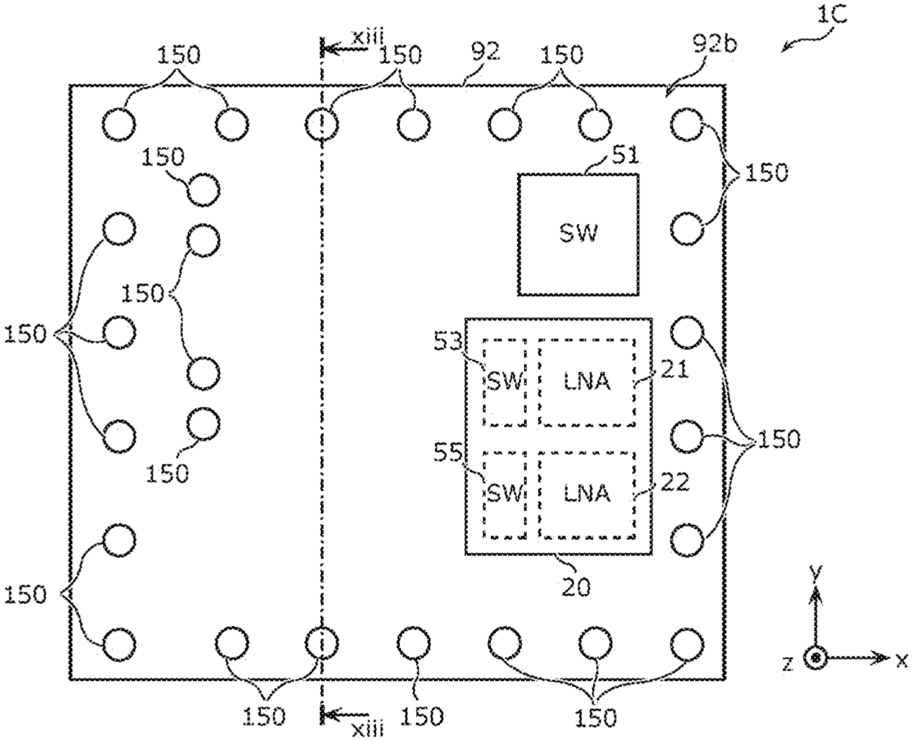
FIG. 12 is a plan view of a fourth major surface of the radio-frequency module according to the third practical example.
Figure 13:
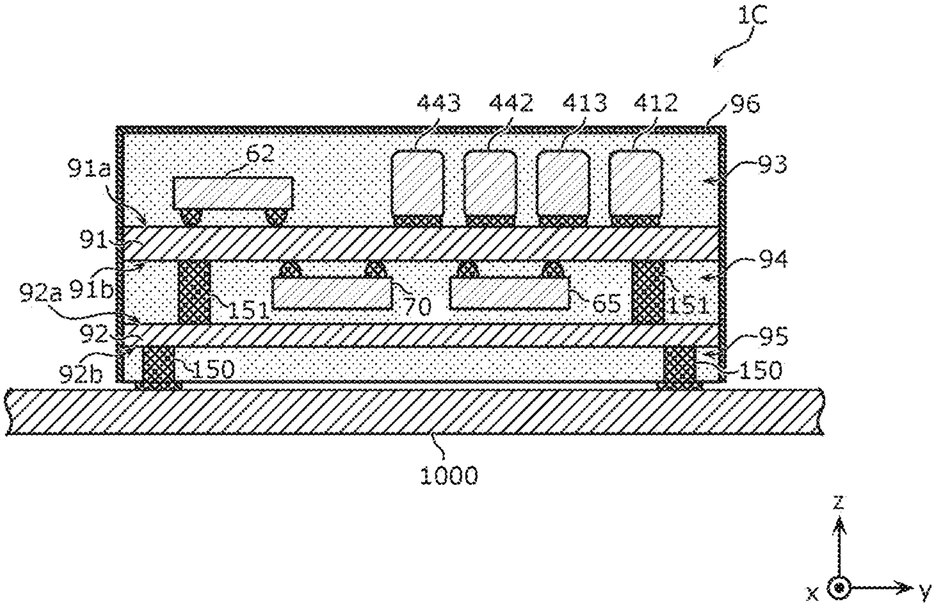
FIG. 13 is a sectional view of the radio-frequency module according to the third practical example.

FIG. 10 is a plan view of a major surface 91*a* of the radio-frequency module 1C according to this practical example. FIG. 11 is a plan view of a major surface 91*b* of a module substrate 91 of the radio-frequency module 1C according to this practical example, under a condition the major surface 91*b* side is viewed through the module substrate 91 from the positive side of the z axis. FIG. 12 is a plan view of a major surface 92*b* of a module substrate 92 of the radio-frequency module 1C according to this practical example, under a condition the major surface 92*b* side is viewed through the module substrate 92 from the positive side of the z axis. FIG. 13 is a sectional view of the radio-frequency module 1C according to this practical example. The section plane of the radio-frequency module 1C in FIG. 13 is taken along line xiii-xiii in FIGS. 10 to 12.

At the major surface 91*a* (an upper tier), the power amplifiers 11 and 12, the matching circuits (chip inductors) 401, 411 to 413, 422, 431 to 433, 441 to 443, 452, and 461 to 463, and the filters 61, 62 and 64 are disposed. No chip inductor is disposed between the major surfaces 91*b* and 92*a* and at the major surface 92*b*. In other words, the chip inductors are disposed only in the upper tier among the three tiers.

Between the major surfaces 91*b* and 92*a* (a middle tier), the filters 63, 65, and 66, the inter-substrate connection terminals 151, and the integrated circuit 70 are disposed. In other words, in this practical example, the integrated circuit 70 is disposed between the major surfaces 91*b* and 92*a* instead of the filter 62.

At the major surface 92*b* (a lower tier), the integrated circuit 20, the switch 51, and the external connection terminals 150 are disposed. In other words, in this practical example, the integrated circuit 70 is not disposed at the major surface 92*b*. Similarly to the first and second practical examples, at the major surface 92*b*, the first electronic component including at least a transistor (the integrated circuit 20 and the switch 51 in this example) is disposed, but the second electronic component not including any transistor (the matching circuits 401, 411 to 413, 422, 431 to 433, 441 to 443, 452, and 461 to 463, and the filters 61 to 66 in this example) is not disposed. This means that at the major surface 92*b*, only the first electronic component among the multiple electronic components is disposed.

2.3.2 Effects of Radio-Frequency Module 1C

As described above, the radio-frequency module 1C according to this practical example includes, similarly to the radio-frequency module 1A according to the first practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include one or more first electronic components each including at least a transistor and one or more second electronic components each not including any transistor. At the major surface 92*b*, at least one of the one or more first electronic components is disposed, and the one or more second electronic components are not disposed.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1C in plan view is decreased; in other words, the size of the radio-frequency module 1C is reduced. Furthermore, only the first electronic component, which has a relatively low profile among the multiple electronic components, is disposed at the major surface 92*b*. This configuration reduces the thickness of the lower tier of the radio-frequency module 1C, consequently lowering the profile of the radio-frequency module 1C. In particular, by thinning the electronic components disposed at the major surface 92*b* and the resin member 95, the thickness of the lower tier can be further reduced.

The radio-frequency module 1C according to this practical example includes, similarly to the radio-frequency module 1A according to the first practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed at the major surface 91*a*. No chip inductor is disposed between the major surfaces 91*b* and 92*a* and at the major surface 92*b*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1C in plan view is decreased; in other words, the size of the radio-frequency module 1C is reduced. The chip inductors, which have relatively high profiles among the multiple electronic components, are all disposed at the major surface 91*a* (the upper tier). As a result, the thickness of two tiers (the middle tier and the lower tier) without chip inductors can be reduced, and the profile of the radio-frequency module 1C can be consequently lowered.

The communication device 5 according to this practical example includes the RFIC 3 configured to process a radio-frequency signal and the radio-frequency module 1C configured to transfer the radio-frequency signal between the RFIC 3 and the antenna 2.

This configuration enables the communication device 5 to achieve effects of the radio-frequency module 1C.

2.4 Fourth Practical Example

Next, as a fourth practical example of the radio-frequency circuit 1 according to the embodiment described above, a radio-frequency module 1D including the radio-frequency circuit 1 will be described. This practical example differs from the practical examples described above mainly in the disposition of the electronic component at the major surface 91*a* and the electronic components between the major surfaces 91*b* and 92*a*. The following describes the radio-frequency module 1D according to this practical example with reference to FIGS. 14 to 17, with a main focus on points different from the practical examples describe above.

2.4.1 Component Arrangement of Radio-Frequency Module 1D

Figure 14:
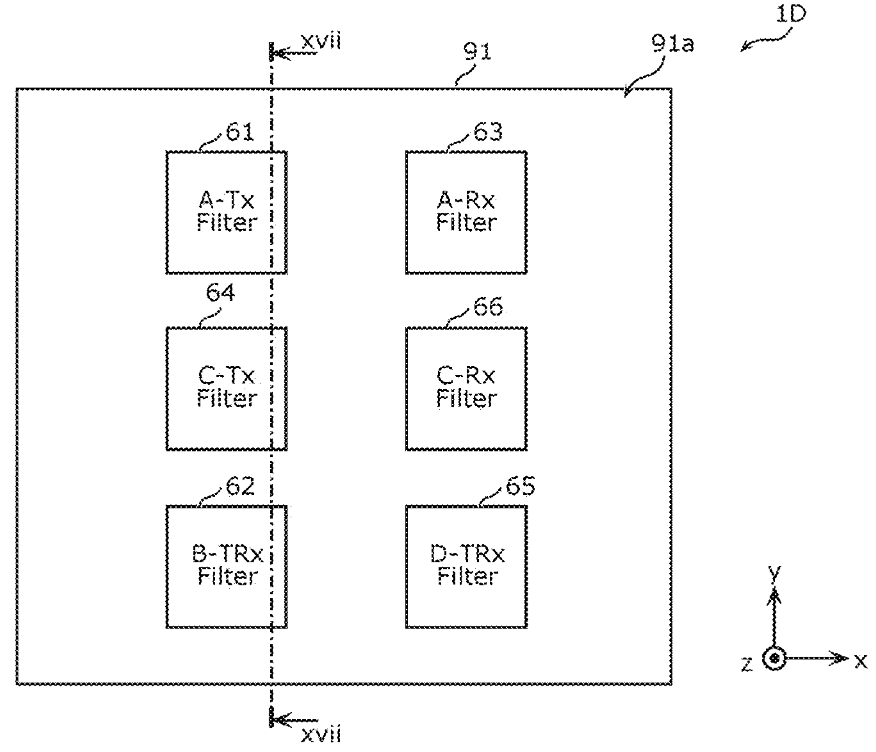
FIG. 14 is a plan view of a first major surface of a radio-frequency module according to a fourth practical example.
Figure 15:
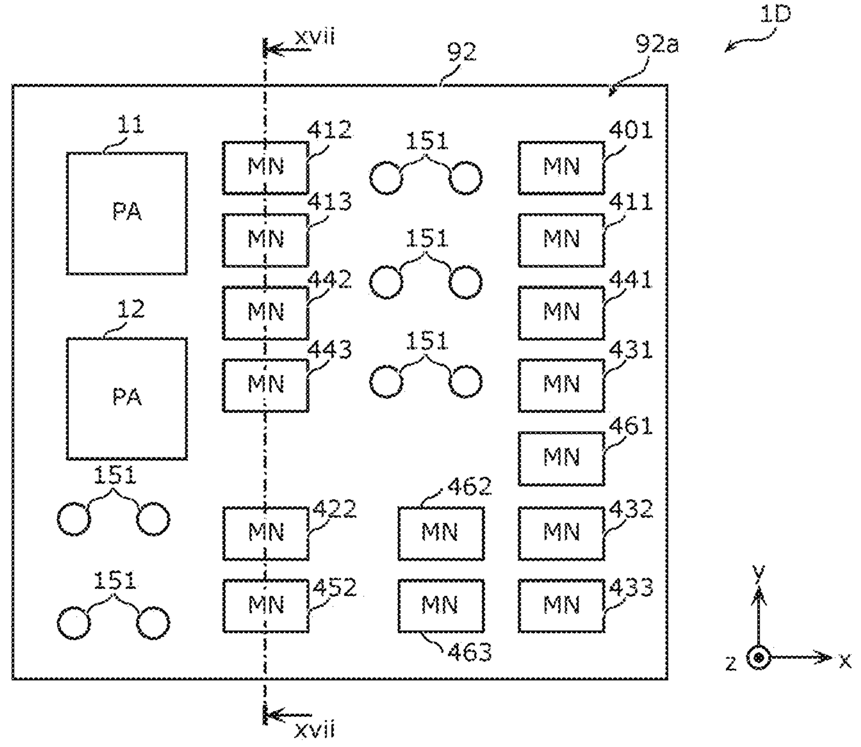
FIG. 15 is a plan view of a third major surface of the radio-frequency module according to the fourth practical example.
Figure 16:
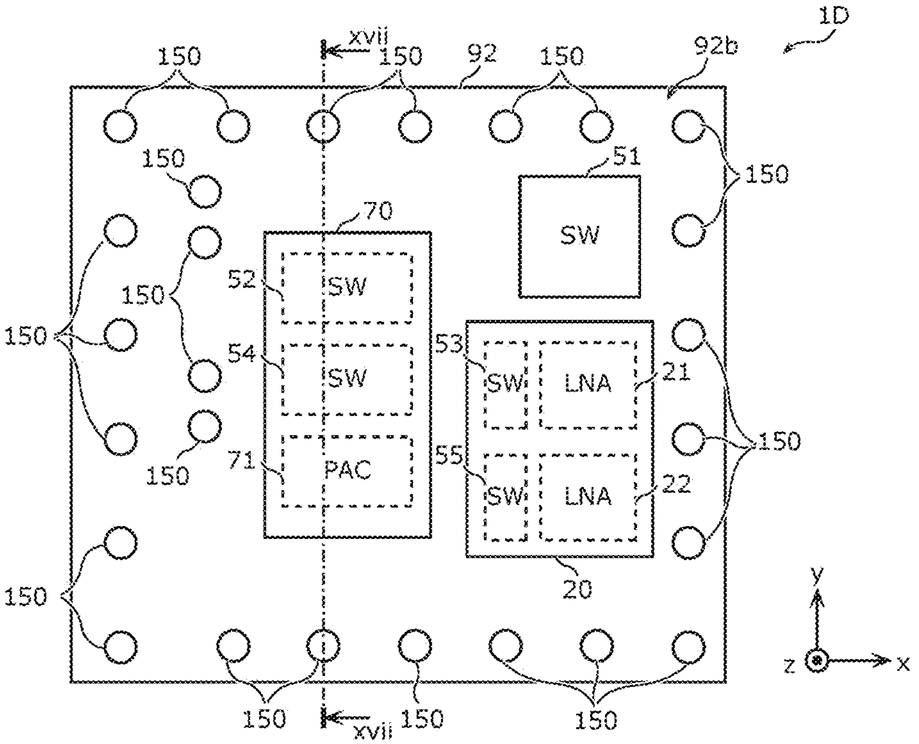
FIG. 16 is a plan view of a fourth major surface of the radio-frequency module according to the fourth practical example.
Figure 17:
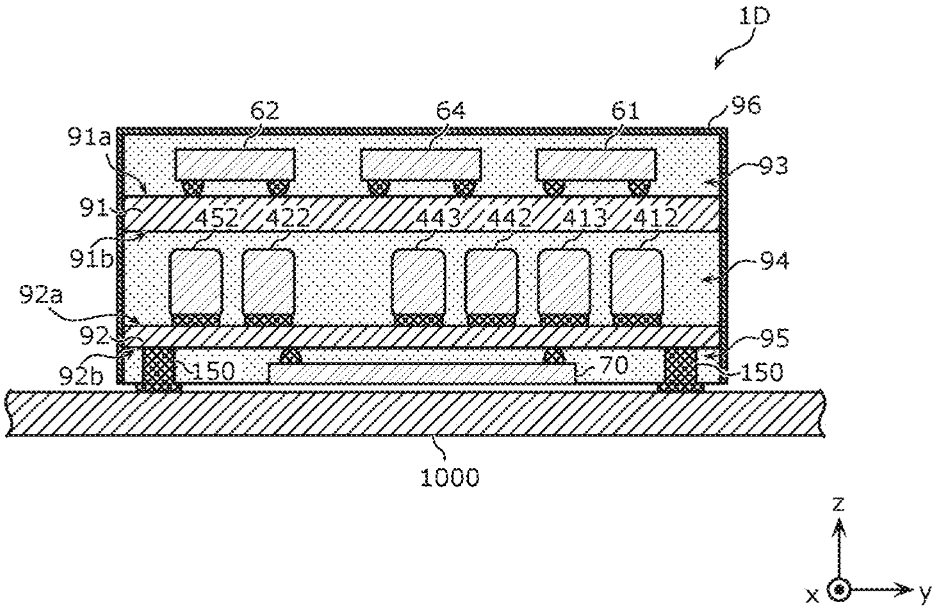
FIG. 17 is a sectional view of the radio-frequency module according to the fourth practical example.

FIG. 14 is a plan view of a major surface 91*a* of the radio-frequency module 1D according to this practical example. FIG. 15 is a plan view of a major surface 92*a* of a module substrate 92 of the radio-frequency module 1D according to this practical example, under a condition the major surface 92*a* side is viewed through the module substrate 92 from the positive side of the z axis. FIG. 16 is a plan view of a major surface 92*b* of a module substrate 92 of the radio-frequency module 1D according to this practical example, under a condition the major surface 92*b* side is viewed through the module substrate 92 from the positive side of the z axis. FIG. 17 is a sectional view of the radio-frequency module 1D according to this practical example. The section plane of the radio-frequency module 1D in FIG. 17 is taken along line xvii-xvii in FIGS. 14 to 16.

At the major surface 91*a* (an upper tier), the filters 61 to 66 are disposed.

Between the major surfaces 91*b* and 92*a* (a middle tier), the power amplifiers 11 and 12, the matching circuits (chip inductors) 401, 411 to 413, 422, 431 to 433, 441 to 443, 452, and 461 to 463, and the inter-substrate connection terminals 151 are disposed. Each of the electronic components disposed between the major surfaces 91*b* and 92*a* (the power amplifiers 11 and 12 and the matching circuits (chip inductors) 401, 411 to 413, 422, 431 to 433, 441 to 443, 452, and 461 to 463 in this example) is electrically coupled to the module substrate 92 through electrodes provided on the side facing the module substrate 92.

The chip inductors (the matching circuits 401, 411 to 413, 422, 431 to 433, 441 to 443, 452, and 461 to 463) are disposed between the major surfaces 91*b* and 92*a*. No chip inductor is disposed at the major surface 91*a* and at the major surface 92*b*. In other words, the chip inductors are disposed only in the middle tier among the three tiers.

Similarly to the first and second practical examples, at the major surface 92*b* (a lower tier), the integrated circuits 20 and 70, the switch 51, and the external connection terminals 150 are disposed. This means that at the major surface 92*b*, the first electronic component including at least a transistor (the integrated circuits 20 and 70 and the switch 51 in this example) is disposed, but the second electronic component not including any transistor (the matching circuits 401, 411 to 413, 422, 431 to 433, 441 to 443, 452, and 461 to 463, and the filters 61 to 66 in this example) is not disposed. In other words, at the major surface 92*b*, only the first electronic component among the multiple electronic components is disposed.

2.4.2 Effects of Radio-Frequency Module 1D

As described above, the radio-frequency module 1D according to this practical example includes, similarly to the radio-frequency module 1A according to the first practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include one or more first electronic components each including at least a transistor and one or more second electronic components each not including any transistor. At the major surface 92*b*, at least one of the one or more first electronic components is disposed, and the one or more second electronic components are not disposed.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1D in plan view is decreased; in other words, the size of the radio-frequency module 1D is reduced. Furthermore, only the first electronic component, which has a relatively low profile among the multiple electronic components, is disposed at the major surface 92*b*. This configuration reduces the thickness of the lower tier of the radio-frequency module 1D, consequently lowering the profile of the radio-frequency module 1D. In particular, by thinning the electronic components disposed at the major surface 92*b* and the resin member 95, the thickness of the lower tier can be further reduced.

For example, it may be possible that in the radio-frequency module 1D according to this practical example, the one or more second electronic components include multiple chip inductors (the matching circuits 401, 411 to 413, 422, 431 to 433, 441 to 443, 452, and 461 to 463 in this practical example), and the multiple chip inductors are disposed between the major surfaces 91*b* and 92*a*, not disposed at the major surface 91*a* or at the major surface 92*b*.

In this configuration, the chip inductors, which have relatively high profiles among the multiple electronic components, are all disposed between the major surfaces 91*b* and 92*a* (the middle tier). As a result, the thickness of two tiers (the upper tier and the lower tier) without chip inductors can be reduced, and the profile of the radio-frequency module 1D can be consequently lowered.

The radio-frequency module 1D according to this practical example includes the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed between the major surfaces 91*b* and 92*a*. No chip inductor is disposed at the major surface 91*a* and at the major surface 92*b*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1D in plan view is decreased; in other words, the size of the radio-frequency module 1D is reduced. Further, the chip inductors, which have relatively high profiles among the multiple electronic components, are all disposed between the major surfaces 91*b* and 92*a* (the middle tier). As a result, the thickness of two tiers (the upper tier and the lower tier) without chip inductors can be reduced, and the profile of the radio-frequency module 1D can be consequently lowered.

The communication device 5 according to this practical example includes the RFIC 3 configured to process a radio-frequency signal and the radio-frequency module 1D configured to transfer the radio-frequency signal between the RFIC 3 and the antenna 2.

This configuration enables the communication device 5 to achieve effects of the radio-frequency module 1D.

2.5 Fifth Practical Example

Next, as a fifth practical example of the radio-frequency circuit 1 according to the embodiment described above, a radio-frequency module 1E including the radio-frequency circuit 1 will be described. This practical example differs from the practical examples described above in the disposition of multiple electronic components. The following describes the radio-frequency module 1E according to this practical example with reference to FIGS. 18 to 21, with a main focus on points different from the practical examples describe above.

2.5.1 Component Arrangement of Radio-Frequency Module 1E

Figure 18:
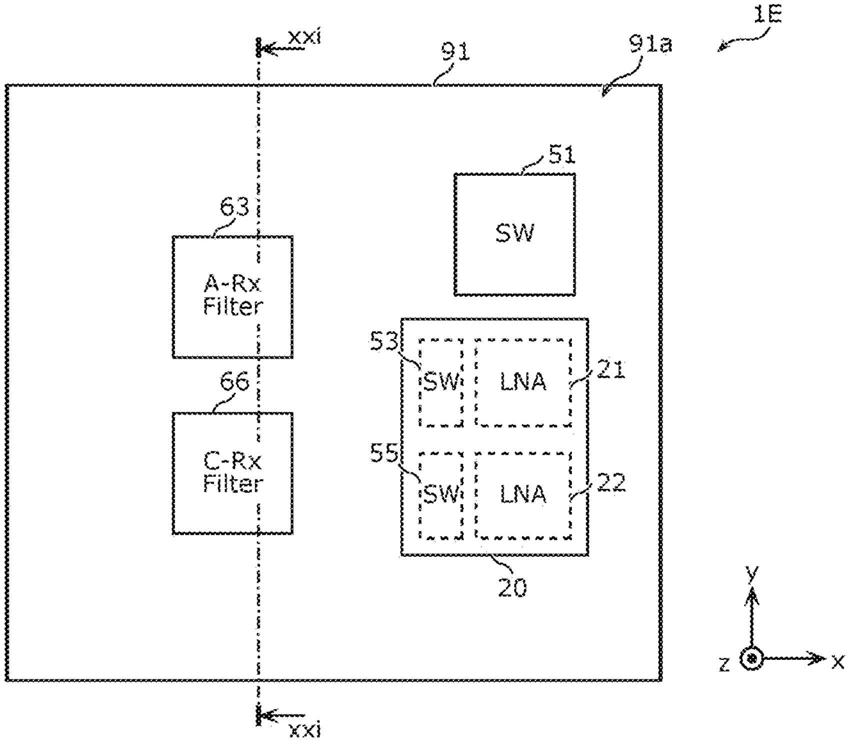
FIG. 18 is a plan view of a first major surface of a radio-frequency module according to a fifth practical example.
Figure 19:
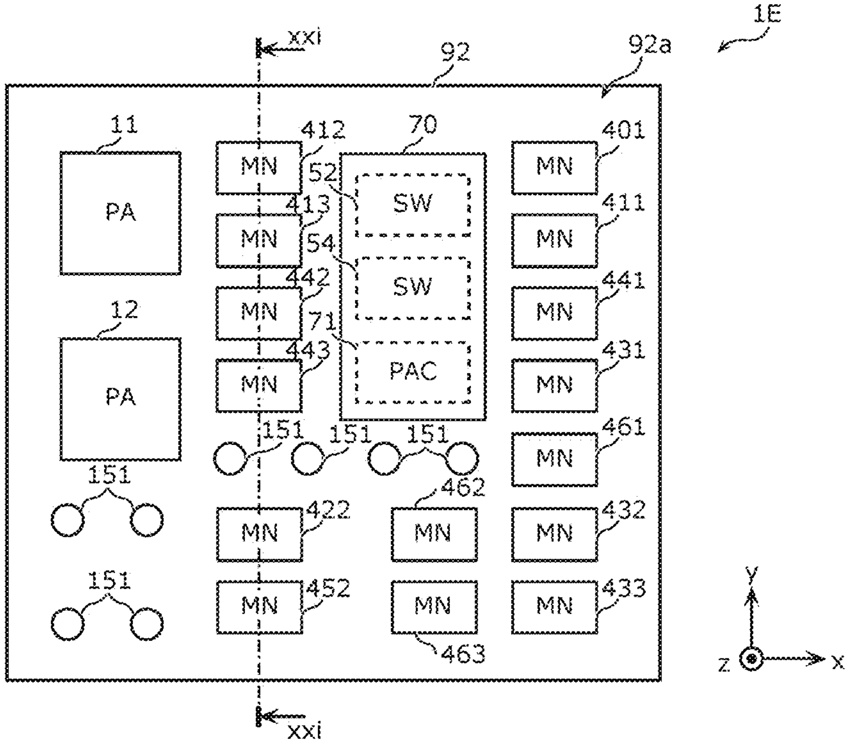
FIG. 19 is a plan view of a third major surface of the radio-frequency module according to the fifth practical example.
Figure 20:
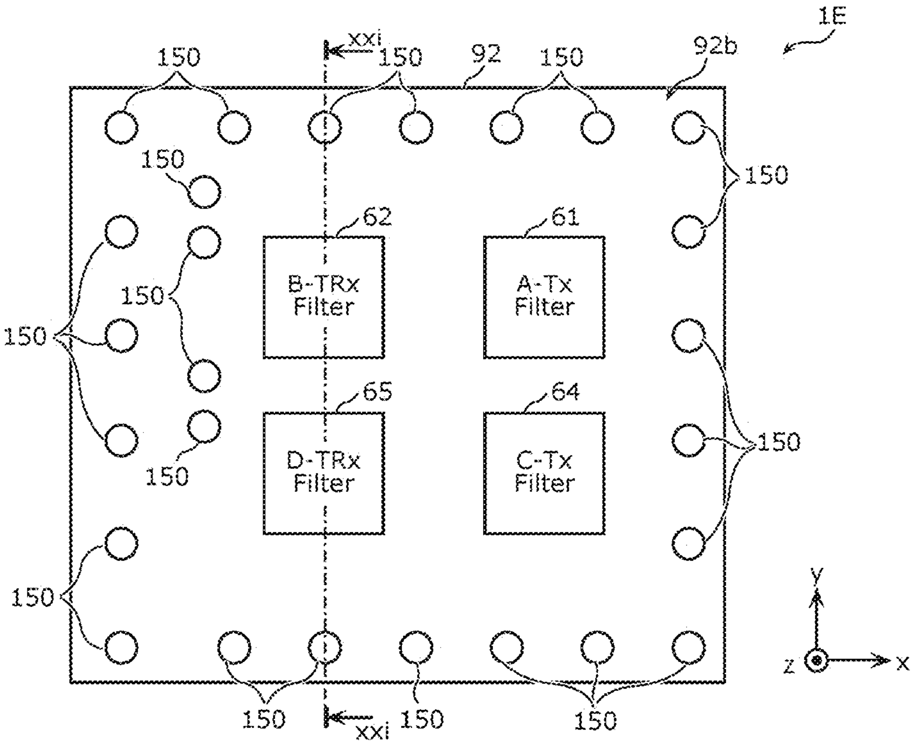
FIG. 20 is a plan view of a fourth major surface of the radio-frequency module according to the fifth practical example.
Figure 21:
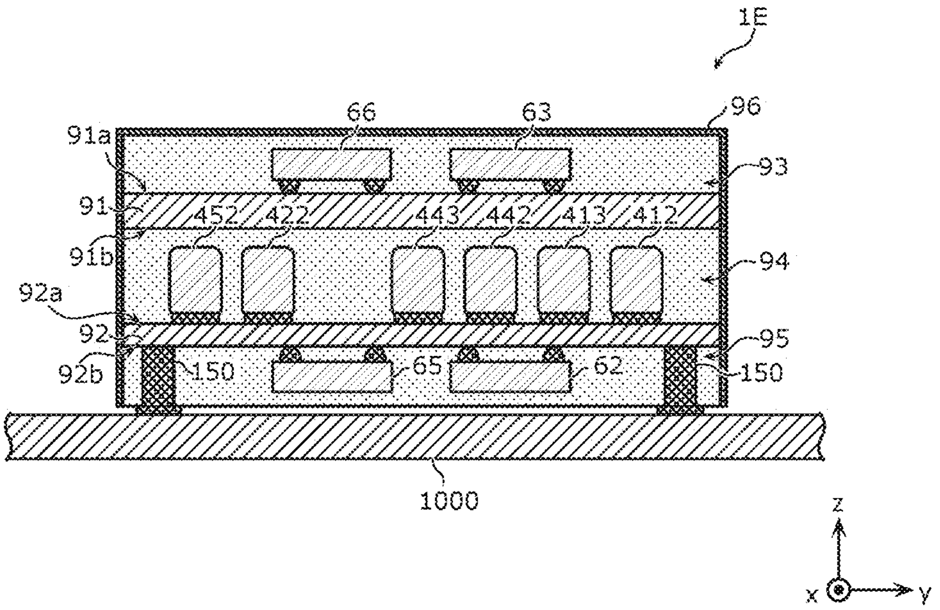
FIG. 21 is a sectional view of the radio-frequency module according to the fifth practical example.

FIG. 18 is a plan view of a major surface 91*a* of the radio-frequency module 1E according to this practical example. FIG. 19 is a plan view of a major surface 92*a* of a module substrate 92 of the radio-frequency module 1E according to this practical example, under a condition the major surface 92*a* side is viewed through the module substrate 92 from the positive side of the z axis. FIG. 20 is a plan view of a major surface 92*b* of a module substrate 92 of the radio-frequency module 1E according to this practical example, under a condition the major surface 92*b* side is viewed through the module substrate 92 from the positive side of the z axis. FIG. 21 is a sectional view of the radio-frequency module 1E according to this practical example. The section plane of the radio-frequency module 1E in FIG. 21 is taken along line xxi-xxi in FIGS. 18 to 20.

At the major surface 91*a* (an upper tier), the integrated circuit 20, the switch 51, and the filters 63 and 66 are disposed.

Between the major surfaces 91*b* and 92*a* (a middle tier), the power amplifiers 11 and 12, the matching circuits (chip inductors) 401, 411 to 413, 422, 431 to 433, 441 to 443, 452, and 461 to 463, the integrated circuit 70, and the inter-substrate connection terminals 151 are disposed. No chip inductor is disposed at the major surface 91*a* and at the major surface 92*b*. In other words, the chip inductors are disposed only in the middle tier among the three tiers.

At the major surface 92*b* (a lower tier), the filters 61, 62, 64, and 65 and the external connection terminals 150 are disposed.

2.5.2 Effects of Radio-Frequency Module 1E

As described above, the radio-frequency module 1E according to this practical example includes, similarly to the radio-frequency module 1D according to the fourth practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed between the major surfaces 91*b* and 92*a*. No chip inductor is disposed at the major surface 91*a* and at the major surface 92*b*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1E in plan view is decreased; in other words, the size of the radio-frequency module 1E is reduced. Further, the chip inductors, which have relatively high profiles among the multiple electronic components, are all disposed between the major surfaces 91*b* and 92*a* (the middle tier). As a result, the thickness of two tiers (the upper tier and the lower tier) without chip inductors can be reduced, and the profile of the radio-frequency module 1E can be consequently lowered.

The communication device 5 according to this practical example includes the RFIC 3 configured to process a radio-frequency signal and the radio-frequency module 1E configured to transfer the radio-frequency signal between the RFIC 3 and the antenna 2.

This configuration enables the communication device 5 to achieve effects of the radio-frequency module 1E.

2.6 Sixth Practical Example

Next, as a sixth practical example of the radio-frequency circuit 1 according to the embodiment described above, a radio-frequency module 1F including the radio-frequency circuit 1 will be described. This practical example differs from the fifth practical example in the disposition of the power amplifiers 11 and 12. The following describes the radio-frequency module 1F according to this practical example with reference to FIGS. 22 to 25, with a main focus on points different from the practical examples describe above.

2.6.1 Component Arrangement of Radio-Frequency Module 1F

Figure 22:
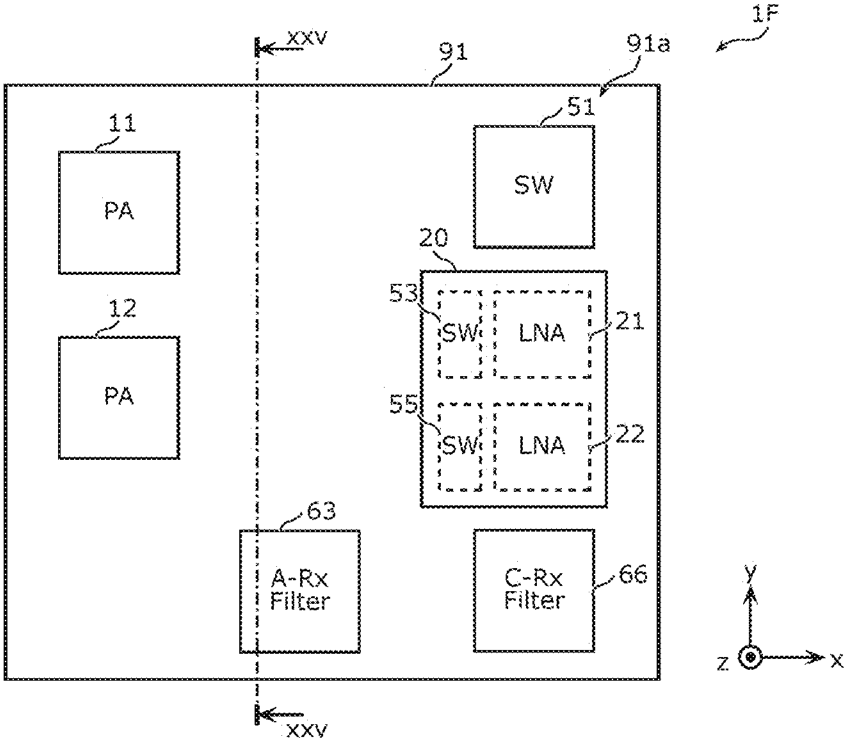
FIG. 22 is a plan view of a first major surface of a radio-frequency module according to a sixth practical example.
Figure 23:
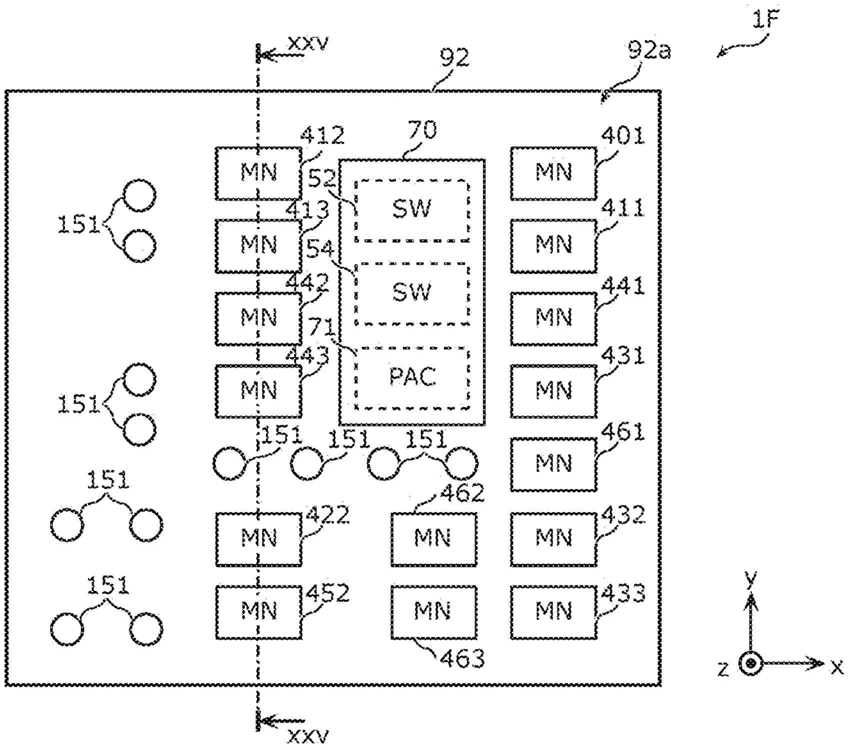
FIG. 23 is a plan view of a third major surface of the radio-frequency module according to the sixth practical example.
Figure 24:
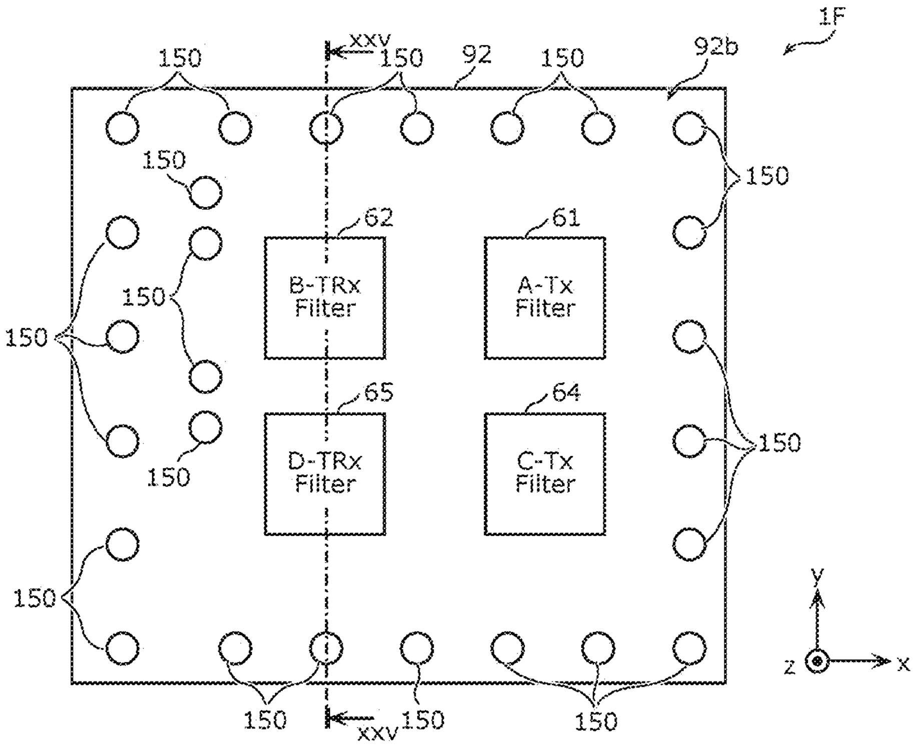
FIG. 24 is a plan view of a fourth major surface of the radio-frequency module according to the sixth practical example.
Figure 25:
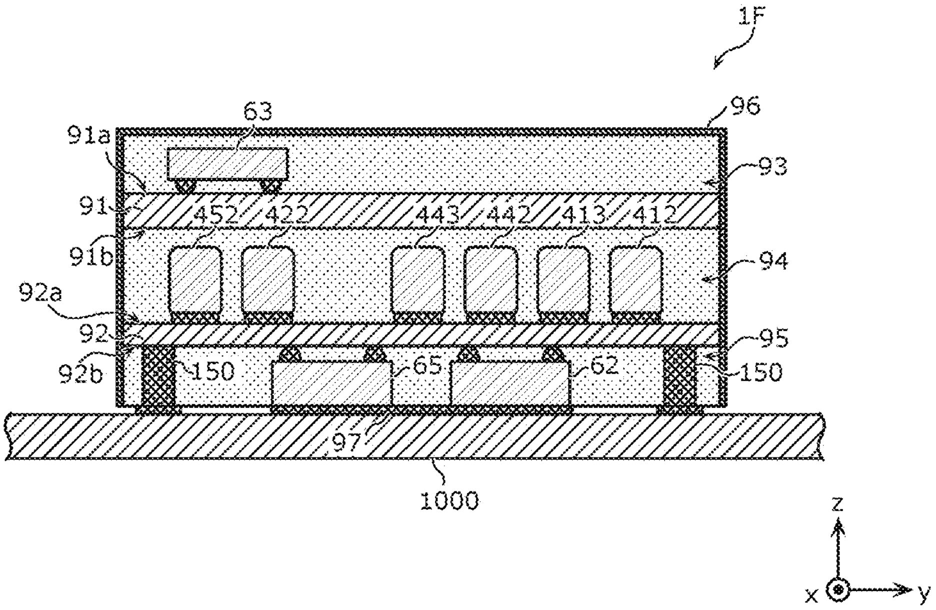
FIG. 25 is a sectional view of the radio-frequency module according to the sixth practical example.

FIG. 22 is a plan view of a major surface 91*a* of the radio-frequency module 1F according to this practical example. FIG. 23 is a plan view of a major surface 92*a* of a module substrate 92 of the radio-frequency module 1F according to this practical example, under a condition the major surface 92*a* side is viewed through the module substrate 92 from the positive side of the z axis. FIG. 24 is a plan view of a major surface 92*b* of a module substrate 92 of the radio-frequency module 1F according to this practical example, under a condition the major surface 92*b* side is viewed through the module substrate 92 from the positive side of the z axis. FIG. 25 is a sectional view of the radio-frequency module 1F according to this practical example. The section plane of the radio-frequency module 1F in FIG. 25 is taken along line xxv-xxv in FIGS. 22 to 24.

At the major surface 91*a* (the upper tier), the power amplifiers 11 and 12, the integrated circuit 20, the switch 51, and the filters 63 and 66 are disposed. In other words, in this practical example, the power amplifiers 11 and 12 are disposed at the major surface 91*a* instead of between the major surfaces 91*b* and 92*a*.

Between the major surfaces 91*b* and 92*a* (a middle tier), the matching circuits (chip inductors) 401, 411 to 413, 422, 431 to 433, 441 to 443, 452, and 461 to 463, the integrated circuit 70, and the inter-substrate connection terminals 151 are disposed. No chip inductor is disposed at the major surface 91*a* and at the major surface 92*b*. In other words, the chip inductors are disposed only in the middle tier among the three tiers.

At the major surface 92*b* (a lower tier), similarly to the fifth practical example, the filters 61, 62, 64, and 65 and the external connection terminals 150 are disposed. In this practical example, a metal member 97 is in contact with a major surface facing the motherboard 1000 of each of the filters 61, 62, 64, and 65. With this configuration, heat from the filters 61, 62, 64, and 65 is dissipated through the metal member 97 toward the motherboard 1000. As such, this configuration enhances the heat dissipation capability of the filters 61, 62, 64, and 65 and consequently improves the temperature characteristics of the filters 61, 62, 64, and 65. The metal member 97 is not necessarily in direct contact with the motherboard 1000; the metal member 97 may be joined to the motherboard 1000 with, for example, solder joints between the metal member 97 and the motherboard 1000.

2.6.2 Effects of Radio-Frequency Module 1F

As described above, the radio-frequency module 1F according to this practical example includes, similarly to the radio-frequency module 1D according to the fourth practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed between the major surfaces 91*b* and 92*a*. No chip inductor is disposed at the major surface 91*a* and at the major surface 92*b*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1F in plan view is decreased; in other words, the size of the radio-frequency module 1F is reduced. Further, the chip inductors, which have relatively high profiles among the multiple electronic components, are all disposed between the major surfaces 91*b* and 92*a* (the middle tier). As a result, the thickness of two tiers (the upper tier and the lower tier) without chip inductors can be reduced, and the profile of the radio-frequency module 1F can be consequently lowered.

The communication device 5 according to this practical example includes the RFIC 3 configured to process a radio-frequency signal and the radio-frequency module 1F configured to transfer the radio-frequency signal between the RFIC 3 and the antenna 2.

This configuration enables the communication device 5 to achieve effects of the radio-frequency module 1F.

2.7 Seventh Practical Example

Next, as a seventh practical example of the radio-frequency circuit 1 according to the embodiment described above, a radio-frequency module 1G including the radio-frequency circuit 1 will be described. This practical example differs from the practical examples described above in the disposition of multiple electronic components. The following describes the radio-frequency module 1G according to this practical example with reference to FIGS. 26 to 29, with a main focus on points different from the practical examples describe above.

2.7.1 Component Arrangement of Radio-Frequency Module 1G

Figure 26:
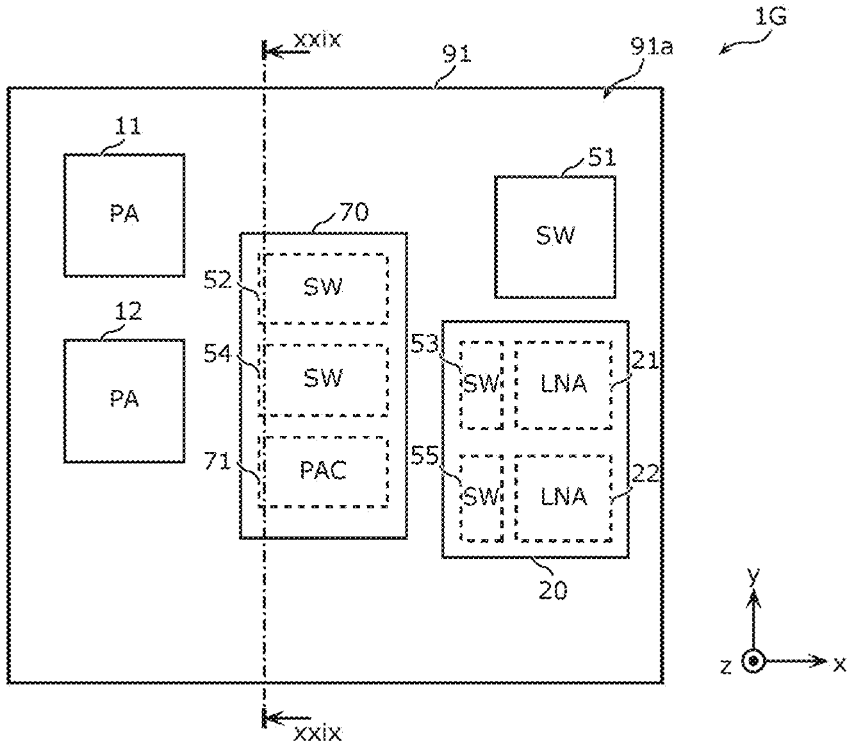
FIG. 26 is a plan view of a first major surface of a radio-frequency module according to a seventh practical example.
Figure 27:
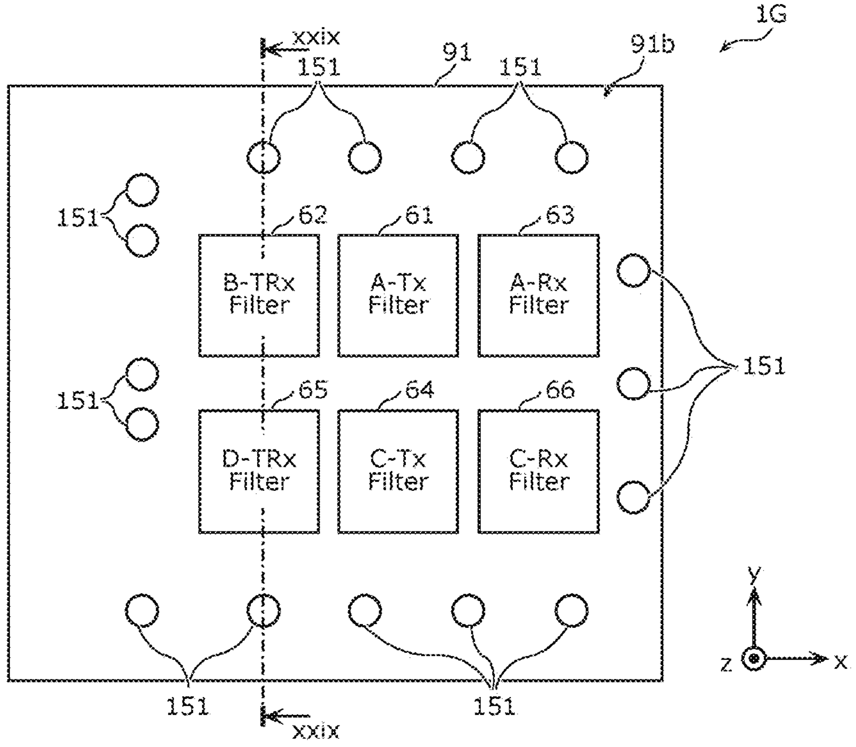
FIG. 27 is a plan view of a second major surface of the radio-frequency module according to the seventh practical example.
Figure 28:
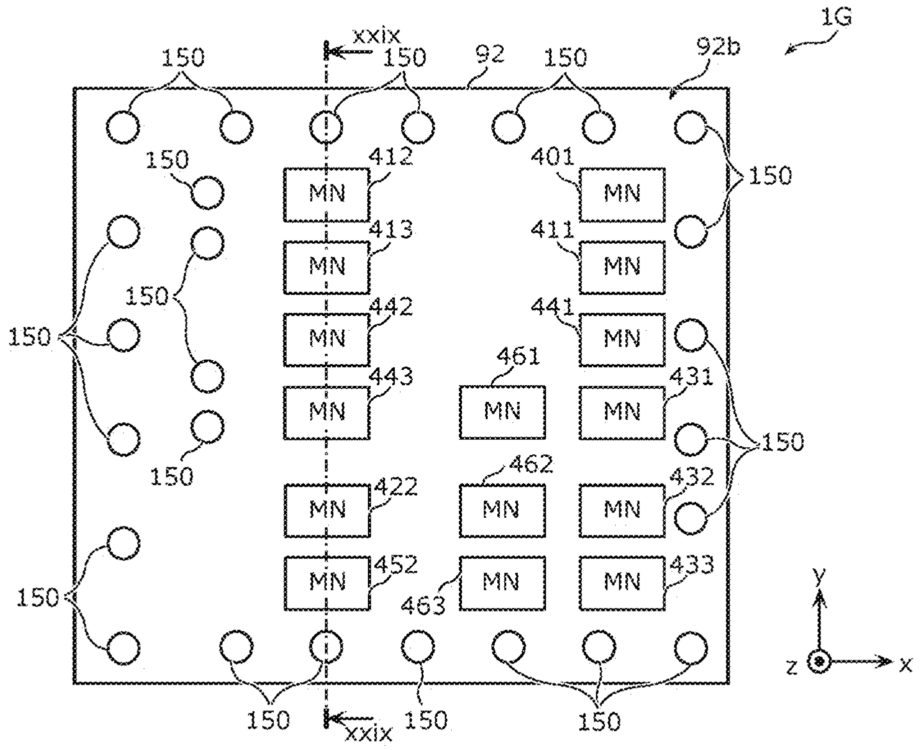
FIG. 28 is a plan view of a fourth major surface of the radio-frequency module according to the seventh practical example.
Figure 29:
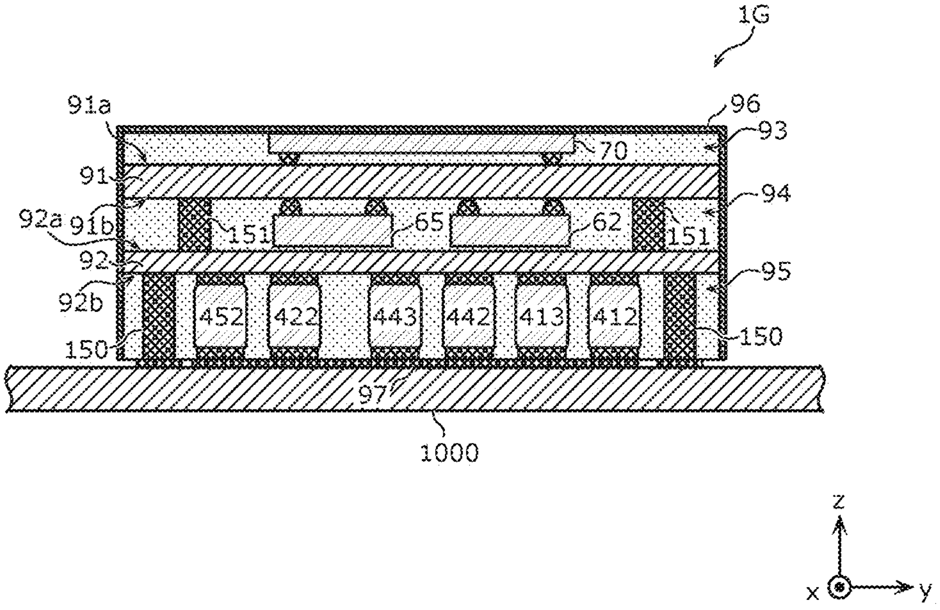
FIG. 29 is a sectional view of the radio-frequency module according to the seventh practical example.

FIG. 26 is a plan view of a major surface 91*a* of the radio-frequency module 1G according to this practical example. FIG. 27 is a plan view of a major surface 91*b* of a module substrate 91 of the radio-frequency module 1G according to this practical example, under a condition the major surface 91*b* side is viewed through the module substrate 91 from the positive side of the z axis. FIG. 28 is a plan view of a major surface 92*b* of a module substrate 92 of the radio-frequency module 1G according to this practical example, under a condition the major surface 92*b* side is viewed through the module substrate 92 from the positive side of the z axis. FIG. 29 is a sectional view of the radio-frequency module 1G according to this practical example. The section plane of the radio-frequency module 1G in FIG. 29 is taken along line xxix-xxix in FIGS. 26 to 28.

At the major surface 91*a* (an upper tier), the power amplifiers 11 and 12, the integrated circuits 20 and 70, and the switch 51 are disposed. The circuit elements that constitute the power amplifiers 11 and 12, the integrated circuits 20 and 70, and the switch 51 are each formed at a circuit plane of a corresponding electronic component. For example, a major surface facing the module substrate 91 of an electronic component is used as the circuit plane.

As described above, at the major surface 91*a*, the first electronic component including at least a transistor (the power amplifiers 11 and 12, the integrated circuits 20 and 70 and the switch 51 in this example) is disposed, but the second electronic component not including any transistor (the matching circuits 401, 411 to 413, 422, 431 to 433, 441 to 443, 452, and 461 to 463, and the filters 61 to 66 in this example) is not disposed. In other words, at the major surface 91*a*, only the first electronic component among the multiple electronic components is disposed. With this configuration, the upper surface of the radio-frequency module 1G can be thinned such that the thickness of each of the resin member 93, the power amplifiers 11 and 12, the integrated circuits 20 and 70, and the switch 51 is reduced.

Between the major surfaces 91*b* and 92*a* (a middle tier), the filters 61 to 66 and the inter-substrate connection terminals 151 are disposed.

At the major surface 92*b* (a lower tier), the matching circuits (chip inductors) 401, 411 to 413, 422, 431 to 433, 441 to 443, 452, and 461 to 463 and the external connection terminals 150 are disposed. No chip inductor is disposed at the major surface 91*a* and between the major surfaces 91*b* and 92*a*. In other words, the chip inductors are disposed only in the lower tier among the three tiers. A chip capacitor may be disposed at the major surface 92*b*.

In this practical example, a metal member 97 is joined to the motherboard 1000 side of at least one of the matching circuits (chip inductors) 401, 411 to 413, 422, 431 to 433, 441 to 443, 452, and 461 to 463. In this configuration, at least one of the matching circuits (chip inductors) 401, 411 to 413, 422, 431 to 433, 441 to 443, 452, and 461 to 463 is electrically coupled to the motherboard 1000 through the metal member 97. This configuration thus reduces interconnections at the module substrate 92.

2.7.2 Effects of Radio-Frequency Module 1G

As described above, the radio-frequency module 1G according to this practical example includes the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include one or more first electronic components each including at least a transistor and one or more second electronic components each not including any transistor. At the major surface 91*a*, at least one of the one or more first electronic components is disposed, and the one or more second electronic components are not disposed.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1G in plan view is decreased; in other words, the size of the radio-frequency module 1G is reduced. Furthermore, only the first electronic component, which has a relatively low profile among the multiple electronic components, is disposed at the major surface 91*a*. This configuration reduces the thickness of the upper tier of the radio-frequency module 1G, consequently lowering the profile of the radio-frequency module 1G. In particular, by thinning the electronic components disposed at the major surface 91*a* and the resin member 93, the thickness of the upper tier can be further reduced.

For example, it may be possible that in the radio-frequency module 1G according to this practical example, the one or more second electronic components include multiple chip inductors, and the multiple chip inductors are disposed at the major surface 92*b*, not disposed between the major surfaces 91*b* and 92*a* or at the major surface 91*a*.

In this configuration, the chip inductors, which have relatively high profiles among the multiple electronic components, are all disposed at the major surface 92*b* (the lower tier). As a result, the thickness of two tiers (the upper tier and the middle tier) without chip inductors can be reduced, and the profile of the radio-frequency module 1G can be consequently lowered.

The radio-frequency module 1G according to this practical example includes the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed at the major surface 92*b*. No chip inductor is disposed between the major surfaces 91*b* and 92*a* and at the major surface 91*a*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1G in plan view is decreased; in other words, the size of the radio-frequency module 1G is reduced. The chip inductors, which have relatively high profiles among the multiple electronic components, are all disposed at the major surface 92*b* (the lower tier). As a result, the thickness of two tiers (the upper tier and the middle tier) without chip inductors can be reduced, and the profile of the radio-frequency module 1G can be consequently lowered.

The communication device 5 according to this practical example includes the RFIC 3 configured to process a radio-frequency signal and the radio-frequency module 1G configured to transfer the radio-frequency signal between the RFIC 3 and the antenna 2.

This configuration enables the communication device 5 to achieve effects of the radio-frequency module 1G.

2.8 Eighth Practical Example

Next, as an eighth practical example of the radio-frequency circuit 1 according to the embodiment described above, a radio-frequency module 1H including the radio-frequency circuit 1 will be described. This practical example differs from the practical examples described above in the disposition of multiple electronic components. The following describes the radio-frequency module 1H according to this practical example with reference to FIGS. 30 to 33, with a main focus on points different from the practical examples describe above.

2.8.1 Component Arrangement of Radio-Frequency Module 1H

Figure 30:
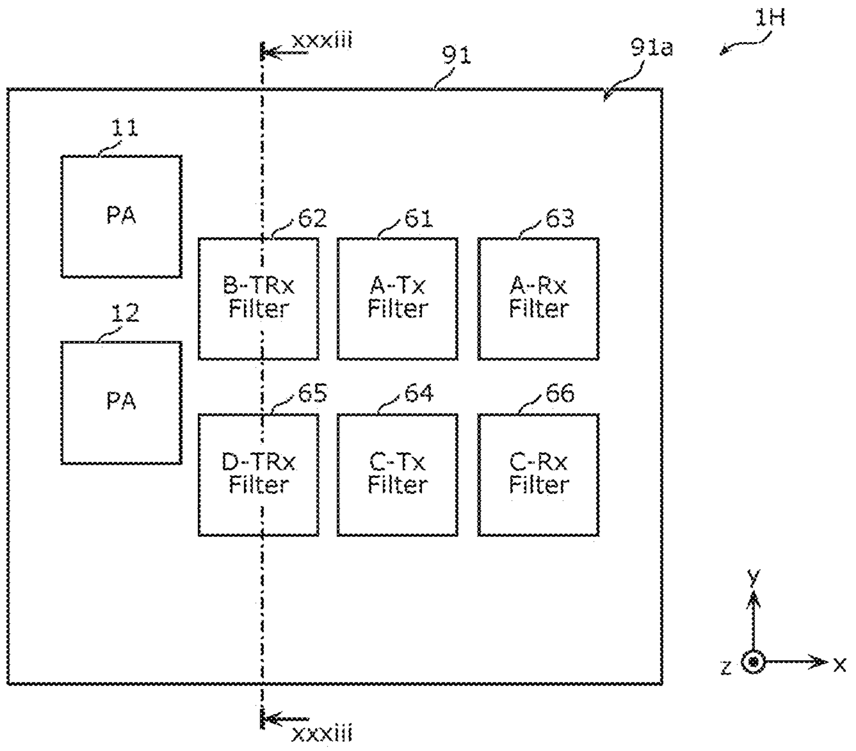
FIG. 30 is a plan view of a first major surface of a radio-frequency module according to an eighth practical example.
Figure 31:
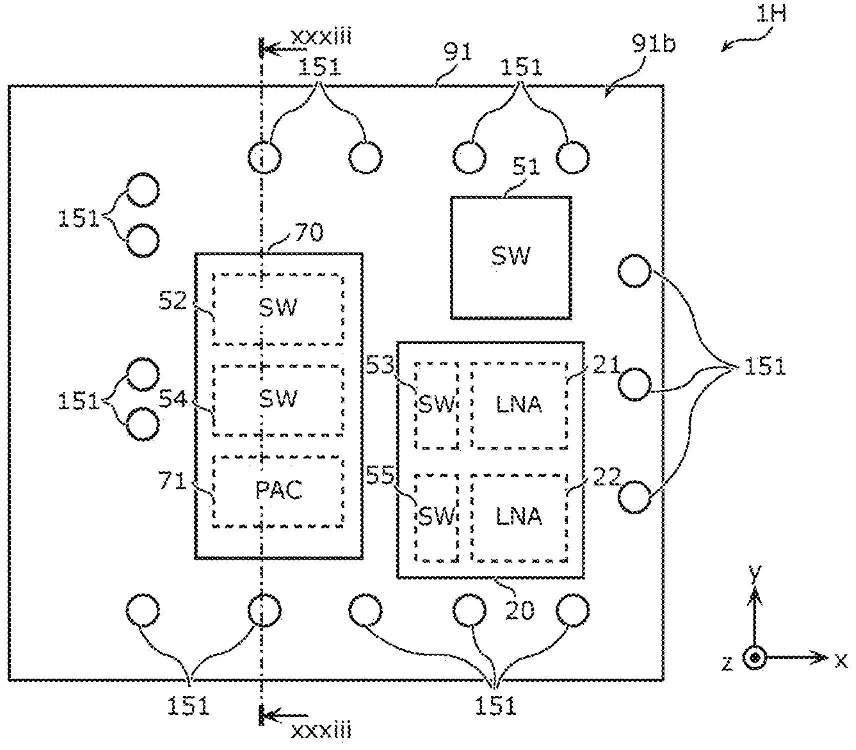
FIG. 31 is a plan view of a second major surface of the radio-frequency module according to the eighth practical example.
Figure 32:
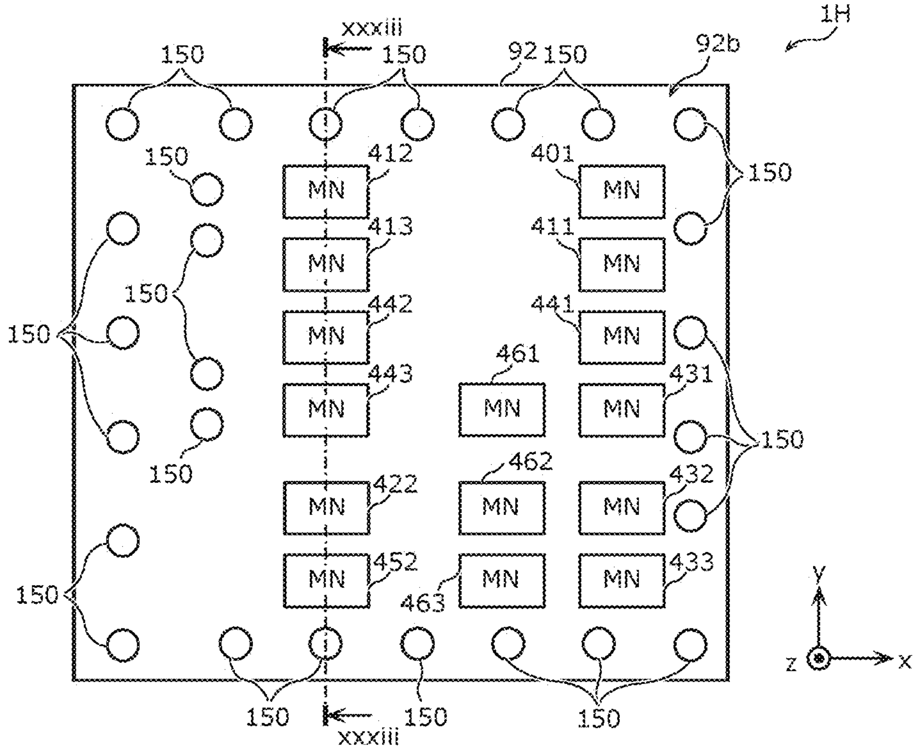
FIG. 32 is a plan view of a fourth major surface of the radio-frequency module according to the eighth practical example.
Figure 33:
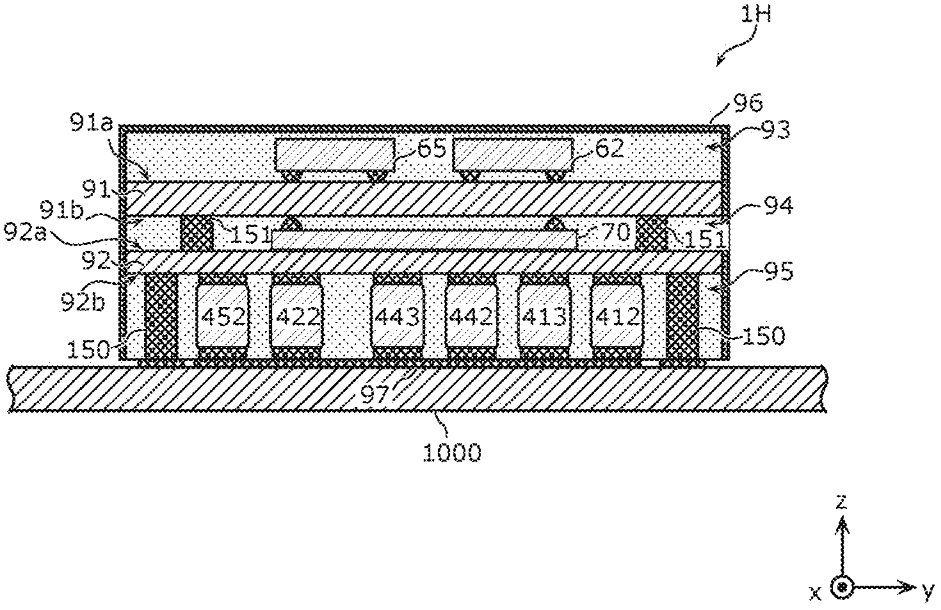
FIG. 33 is a sectional view of the radio-frequency module according to the eighth practical example.

FIG. 30 is a plan view of a major surface 91*a* of the radio-frequency module 1H according to this practical example. FIG. 31 is a plan view of a major surface 91*b* of a module substrate 91 of the radio-frequency module 1H according to this practical example, under a condition the major surface 91*b* side is viewed through the module substrate 91 from the positive side of the z axis. FIG. 32 is a plan view of a major surface 92*b* of a module substrate 92 of the radio-frequency module 1H according to this practical example, under a condition the major surface 92*b* side is viewed through the module substrate 92 from the positive side of the z axis. FIG. 33 is a sectional view of the radio-frequency module 1H according to this practical example. The section plane of the radio-frequency module 1H in FIG. 33 is taken along line xxxiii-xxxiii in FIGS. 30 to 32.

At the major surface 91*a* (an upper tier), the power amplifiers 11 and 12 and the filters 61 to 66 are disposed.

Between the major surfaces 91*b* and 92*a* (a middle tier), the integrated circuits 20 and 70, the switch 51, and the inter-substrate connection terminals 151 are disposed. The circuit elements that constitute the integrated circuits 20 and 70 and the switch 51 are each formed at a circuit plane of a corresponding electronic component. For example, a major surface facing the module substrate 91 of an electronic component is used as the circuit plane.

As described above, between the major surfaces 91*b* and 92*a*, the first electronic component including at least a transistor (the integrated circuits 20 and 70 and the switch 51 in this example) is disposed, but the second electronic component not including any transistor (the matching circuits 401, 411 to 413, 422, 431 to 433, 441 to 443, 452, and 461 to 463, and the filters 61 to 66 in this example) is not disposed. In other words, between the major surfaces 91*b* and 92*a*, only the first electronic component among the multiple electronic components is disposed. With this configuration, before the module substrates 91 and 92 are joined, the resin member 94 and the first electronic component can be thinned from the major surface 91*b* side of the module substrate 91, so that the thickness of the resin member 94 and the thickness of the first electronic component are reduced.

At the major surface 92*b* (a lower tier), similarly to the seventh practical example, the matching circuits (chip inductors) 401, 411 to 413, 422, 431 to 433, 441 to 443, 452, and 461 to 463 and the external connection terminals 150 are disposed. No chip inductor is disposed at the major surface 91*a* and between the major surfaces 91*b* and 92*a*. In other words, the chip inductors are disposed only in the lower tier among the three tiers.

In this practical example, similarly to the seventh practical example, a metal member 97 is joined to the motherboard 1000 side of the matching circuits (chip inductors) 401, 411 to 413, 422, 431 to 433, 441 to 443, 452, and 461 to 463. In this configuration, the matching circuits (chip inductors) 401, 411 to 413, 422, 431 to 433, 441 to 443, 452, and 461 to 463 are electrically coupled to the motherboard 1000 through the metal member 97. This configuration thus reduces interconnections at the module substrate 92.

2.8.2 Effects of Radio-Frequency Module 1H

As described above, the radio-frequency module 1H according to this practical example includes the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include one or more first electronic components each including at least a transistor and one or more second electronic components each not including any transistor. Between the major surfaces 91*b* and 92*a*, at least one of the one or more first electronic components is disposed, and the one or more second electronic components are not disposed.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1H in plan view is decreased; in other words, the size of the radio-frequency module 1H is reduced. Furthermore, only the first electronic component, which has a relatively low profile among the multiple electronic components, is disposed between the major surfaces 91*b* and 92*a*. This configuration reduces the thickness of the middle tier of the radio-frequency module 1H, consequently lowering the profile of the radio-frequency module 1H. In particular, by thinning the electronic components disposed between the major surfaces 91*b* and 92*a* and the resin member 94, the thickness of the middle tier can be further reduced.

For example, it may be possible that in the radio-frequency module 1H according to this practical example, the one or more second electronic components include multiple chip inductors, and the multiple chip inductors are disposed at the major surface 92*b*, not disposed between the major surfaces 91*b* and 92*a* or at the major surface 91*a*.

In this configuration, the chip inductors, which have relatively high profiles among the multiple electronic components, are all disposed at the major surface 92*b* (the lower tier). As a result, the thickness of two tiers (the upper tier and the middle tier) without chip inductors can be reduced, and the profile of the radio-frequency module 1H can be consequently lowered.

The radio-frequency module 1H according to this practical example includes, similarly to the radio-frequency module 1G according to the seventh practical example, the module substrates 91 and 92, multiple electronic components, and the external connection terminals 150. The module substrate 91 has the major surfaces 91*a* and 91*b* that are opposite to each other. The module substrate 92 has the major surfaces 92*a* and 92*b* that are opposite to each other. The module substrate 92 is disposed such that the major surface 92*a* faces the major surface 91*b*. The multiple electronic components are disposed between the major surfaces 91*b* and 92*a*, at the major surface 91*a*, or at the major surface 92*b*. The external connection terminals 150 are disposed at the major surface 92*b*. The multiple electronic components include multiple chip inductors. The multiple chip inductors are disposed at the major surface 92*b*. No chip inductor is disposed between the major surfaces 91*b* and 92*a* and at the major surface 91*a*.

In this configuration, the multiple electronic components are disposed in three tiers: one tier between the major surfaces 91*b* and 92*a*, another tier above the major surface 91*a*, and still another tier below the major surface 92*b*. Consequently, the area of the radio-frequency module 1H in plan view is decreased; in other words, the size of the radio-frequency module 1H is reduced. The chip inductors, which have relatively high profiles among the multiple electronic components, are all disposed at the major surface 92*b* (the lower tier). As a result, the thickness of two tiers (the upper tier and the middle tier) without chip inductors can be reduced, and the profile of the radio-frequency module 1H can be consequently lowered.

The communication device 5 according to this practical example includes the RFIC 3 configured to process a radio-frequency signal and the radio-frequency module 1H configured to transfer the radio-frequency signal between the RFIC 3 and the antenna 2.

This configuration enables the communication device 5 to achieve effects of the radio-frequency module 1H.

Modified Examples

The radio-frequency module and communication device according to the present disclosure have been described based on the embodiment and practical examples, but the radio-frequency module and communication device according to the present disclosure are not limited to the embodiment and practical examples described above. The present disclosure also embraces other practical examples implemented as any combination of the constituent elements of the practical examples, other modified examples obtained by making various modifications that occur to those skilled in the art without departing from the scope of the embodiment and practical examples described above, and various hardware devices including the radio-frequency module.

For example, in the circuit configuration of the radio-frequency circuit and communication device according to the embodiment described above, other circuit elements, interconnections, and/or other elements may also be inserted in the paths connecting the circuit elements and the signal paths that are illustrated in the drawings. For example, matching circuits may be inserted between the switch 51 and the filter 62 and/or between the switch 51 and the filter 65.

The arrangements of multiple electronic components in the practical examples described above are merely examples, and the practical examples are not to be interpreted as limiting. For example, an electronic component in one of the practical examples may be positioned at the location of the electronic component in another of the practical examples. For example, in the practical examples, the integrated circuit 70 including the PA controller 71 may be stacked on the power amplifier 11 and/or the power amplifier 12. For example, in the radio-frequency module 1A according to the first practical example, the power amplifiers 11 and 12 may be disposed between the major surfaces 91*b* and 92*a*, similarly to the fourth and fifth practical examples.

In the practical examples, copper post electrodes are used as the external connection terminals 150, but this is not to be interpreted as limiting. For example, bump electrodes may be used as the external connection terminals 150. In this case, the radio-frequency module does not necessarily include the resin member 95.

INDUSTRIAL APPLICABILITY

The present disclosure can be used as a radio-frequency module provided at the front-end in a wide variety of communication devices such as mobile phones.

REFERENCE SIGNS LIST

1 radio-frequency circuit
1A, 1B, 1C, 1D, 1E, 1F, 1G, 1H radio-frequency module
2 antenna
3 RFIC
4 BBIC
5 communication device
11, 12 power amplifier
70 integrated circuit
21, 22 low-noise amplifier
51, 52, 53, 54, 55 switch
61, 62, 63, 64, 65, 66 filter
71 PA controller
91, 92 module substrate
91*a*, 91*b*, 92*a*, 92*b* major surface
93, 94, 95 resin member
96 shield electrode layer
97 metal member
100 antenna connection terminal
111, 112 radio-frequency input terminal
121, 122 radio-frequency output terminal
131 control terminal
150 external connection terminal
151 inter-substrate connection terminal
401, 411, 412, 413, 422, 431, 432, 433, 441, 442, 443, 452, 461, 462, 463 matching circuit
440 IPD
511, 512, 513, 514, 515, 516, 517, 521, 522, 523, 524, 531, 532, 533, 541, 542, 543, 544, 551, 552, 553 terminal
1000 motherboard

The invention claimed is:

1. A radio-frequency module comprising:
a first module substrate having a first major surface and a second major surface that are opposite to each other;
a second module substrate having a third major surface and a fourth major surface that are opposite to each other, the second module substrate being disposed such that the third major surface faces the second major surface;
respective electric components of a plurality of electronic components are disposed
between the second major surface and the third major surface,
at the first major surface, or
at the fourth major surface; and
a plurality of external connection terminals disposed at the fourth major surface, wherein
the plurality of electronic components include one or more first electronic components that each include at least a transistor, and one or more second electronic components that each do not include any transistor, and
between the second major surface and the third major surface, at the first major surface, or at the fourth major surface, at least one of the one or more first electronic components is disposed, and the one or more second electronic components are not disposed.

2. The radio frequency module according to claim 1, wherein at the fourth major surface, the at least one of the one or more first electronic components is disposed, and the one or more second electronic components are not disposed.

3. The radio frequency module according to claim 2, wherein the one or more second electronic components include a plurality of chip inductors, at the first major surface, the plurality of chip inductors are disposed, and between the second major surface and the third major surface and at the fourth major surface, no chip inductor is disposed.

4. The radio frequency module according to claim 3, wherein the one or more first electronic components include a low-noise amplifier, and the low-noise amplifier is disposed at the fourth major surface.

5. The radio frequency module according to claim 4, wherein the one or more first electronic components include a power amplifier, and the power amplifier is disposed at the first major surface.

6. The radio frequency module according to claim 5, wherein the one or more first electronic components include a controller configured to control the power amplifier, and the controller is disposed at the fourth major surface.

7. The radio frequency module according to claim 6, wherein the one or more second electronic components include a first filter coupled to the power amplifier, and the first filter is disposed at the first major surface.

8. The radio frequency module according to claim 7, wherein the one or more second electronic components include a second filter coupled to the low-noise amplifier, and the second filter is disposed between the second major surface and the third major surface.

9. The radio frequency module according to claim 8, wherein the one or more second electronic components include a third filter coupled to the power amplifier and the low-noise amplifier, and the third filter is disposed between the second major surface and the third major surface.

10. The radio frequency module according to claim 3, wherein the one or more second electronic components include an integrated passive device, and the integrated passive device is disposed between the second major surface and the third major surface.

11. The radio frequency module according to claim 2, wherein the one or more second electronic components include a plurality of chip inductors, the plurality of chip inductors are disposed between the second major surface and the third major surface, and at the first major surface and at the fourth major surface, no chip inductor is disposed.

12. The radio frequency module according to claim 1, wherein at the first major surface, the at least one of the one or more first electronic components is disposed, and the one or more second electronic components are not disposed.

13. The radio frequency module according to claim 12, wherein the one or more second electronic components include a plurality of chip inductors, at the fourth major surface, the plurality of chip inductors are disposed, and between the second major surface and the third major surface as well as at the first major surface, no chip inductor is disposed.

14. The radio frequency module according to claim 1, wherein between the second major surface and the third major surface, the at least one of the one or more first electronic components is disposed, and the one or more second electronic components are not disposed.

15. A communication device comprising:

a signal processing circuit configured to process a radio-frequency signal; and the radio frequency module according to claim 1, the radio-frequency module being configured to transfer the radio-frequency signal between the signal processing circuit and an antenna.

16. A radio-frequency module comprising:

a first module substrate having a first major surface and a second major surface that are opposite to each other;

a second module substrate having a third major surface and a fourth major surface that are opposite to each other, the second module substrate being disposed such that the third major surface faces the second major surface;

respective electric components of a plurality of electronic components are disposed between the second major surface and the third major surface, at the first major surface, or at the fourth major surface; and a plurality of external connection terminals disposed at the fourth major surface, wherein the plurality of electronic components include a plurality of chip inductors, and between the second major surface and the third major surface, the plurality of chip inductors are disposed, and at the first major surface and at the fourth major surface, no chip inductor is disposed;

at the first major surface, the plurality of chip inductors are disposed, and between the second major surface and the third major surface and at the fourth major surface, no chip inductor is disposed; or at the fourth major surface, the plurality of chip inductors are disposed, and between the second major surface and the third major surface and at the first major surface, no chip inductor is disposed.

17. The radio frequency module according to claim 16, wherein the plurality of chip inductors are disposed at the first major surface.

18. The radio frequency module according to claim 16, wherein the plurality of chip inductors are disposed between the second major surface and the third major surface.

19. The radio frequency module according to claim 16, wherein the plurality of chip inductors are disposed at the fourth major surface.

20. A communication device comprising:

a signal processing circuit configured to process a radio-frequency signal; and the radio frequency module according to claim 16, the radio-frequency module being configured to transfer the radio-frequency signal between the signal processing circuit and an antenna.

* * * * *